US011545454B2

(12) United States Patent
Tanaka et al.

(10) Patent No.: US 11,545,454 B2
(45) Date of Patent: Jan. 3, 2023

(54) SEMICONDUCTOR DEVICE

(71) Applicant: ROHM CO., LTD., Kyoto (JP)

(72) Inventors: Bungo Tanaka, Kyoto (JP); Keiji Wada, Kyoto (JP); Satoshi Kageyama, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 97 days.

(21) Appl. No.: 17/230,339

(22) Filed: Apr. 14, 2021

(65) Prior Publication Data

US 2021/0233882 A1 Jul. 29, 2021

Related U.S. Application Data

(63) Continuation of application No. 16/842,548, filed on Apr. 7, 2020, now Pat. No. 11,011,489, which is a
(Continued)

(30) Foreign Application Priority Data

Sep. 28, 2016 (JP) .................. 2016-190018
Sep. 28, 2016 (JP) .................. 2016-190019
Sep. 15, 2017 (JP) .................. 2017-177980

(51) Int. Cl.
*H01L 23/00* (2006.01)
*H01L 23/31* (2006.01)
(Continued)

(52) U.S. Cl.
CPC .......... *H01L 24/13* (2013.01); *H01L 23/3114* (2013.01); *H01L 23/49548* (2013.01);
(Continued)

(58) Field of Classification Search
CPC ......... H01L 24/13; H01L 24/03; H01L 24/05; H01L 24/06; H01L 24/29; H01L 24/32;
(Continued)

(56) References Cited

U.S. PATENT DOCUMENTS

2004/0137721 A1* 7/2004 Lim .................. H01L 21/76849
257/E21.171
2008/0012133 A1 1/2008 Shih et al.
(Continued)

FOREIGN PATENT DOCUMENTS

JP 2004022699 A 1/2004
JP 2006108233 A 4/2006
(Continued)

OTHER PUBLICATIONS

Japanese Patent Office; Notice of Reasons for Refusal for Japanese Patent Application 2017-177980 (related application); dated Jul. 29, 2021; Kuwahara, Kiyoshi; 16 pages.

*Primary Examiner* — Marc Anthony Armand
(74) *Attorney, Agent, or Firm* — Gregory M. Howison

(57) ABSTRACT

A semiconductor device includes an insulating layer, a barrier electrode layer formed on the insulating layer, a Cu electrode layer that includes a metal composed mainly of copper and that is formed on a principal surface of the barrier electrode layer, and an outer-surface insulating film that includes copper oxide, that coats an outer surface of the Cu electrode layer, and that is in contact with the principal surface of the barrier electrode layer.

18 Claims, 29 Drawing Sheets

Related U.S. Application Data continuation of application No. 16/561,747, filed on Sep. 5, 2019, now Pat. No. 10,651,144, which is a continuation of application No. 15/717,449, filed on Sep. 27, 2017, now Pat. No. 10,453,816.

(51) Int. Cl.

| | | |
|---|---|---|
| *H01L 23/522* | (2006.01) | |
| *H01L 23/495* | (2006.01) | |
| *H01L 23/528* | (2006.01) | |
| *H01L 23/532* | (2006.01) | |

(52) U.S. Cl.
CPC .... *H01L 23/49582* (2013.01); *H01L 23/5226* (2013.01); *H01L 23/5283* (2013.01); *H01L 24/03* (2013.01); *H01L 24/05* (2013.01); *H01L 24/06* (2013.01); *H01L 23/3107* (2013.01); *H01L 23/53223* (2013.01); *H01L 23/53238* (2013.01); *H01L 23/562* (2013.01); *H01L 24/29* (2013.01); *H01L 24/32* (2013.01); *H01L 24/45* (2013.01); *H01L 24/48* (2013.01); *H01L 24/49* (2013.01); *H01L 24/73* (2013.01); *H01L 24/83* (2013.01); *H01L 2224/02166* (2013.01); *H01L 2224/04042* (2013.01); *H01L 2224/05012* (2013.01); *H01L 2224/05147* (2013.01); *H01L 2224/05155* (2013.01); *H01L 2224/05582* (2013.01); *H01L 2224/05655* (2013.01); *H01L 2224/05664* (2013.01); *H01L 2224/1318* (2013.01); *H01L 2224/13018* (2013.01); *H01L 2224/1357* (2013.01); *H01L 2224/13082* (2013.01); *H01L 2224/13147* (2013.01); *H01L 2224/13166* (2013.01); *H01L 2224/13171* (2013.01); *H01L 2224/13176* (2013.01); *H01L 2224/13181* (2013.01); *H01L 2224/13184* (2013.01); *H01L 2224/13647* (2013.01); *H01L 2224/293* (2013.01); *H01L 2224/29101* (2013.01); *H01L 2224/32245* (2013.01); *H01L 2224/45124* (2013.01); *H01L 2224/45144* (2013.01); *H01L 2224/45147* (2013.01); *H01L 2224/48091* (2013.01); *H01L 2224/48227* (2013.01); *H01L 2224/48247* (2013.01); *H01L 2224/48465* (2013.01); *H01L 2224/49171* (2013.01); *H01L 2224/73265* (2013.01); *H01L 2224/83439* (2013.01); *H01L 2224/83801* (2013.01); *H01L 2924/01022* (2013.01); *H01L 2924/01024* (2013.01); *H01L 2924/01028* (2013.01); *H01L 2924/01029* (2013.01); *H01L 2924/01042* (2013.01); *H01L 2924/01044* (2013.01); *H01L 2924/01046* (2013.01); *H01L 2924/01073* (2013.01); *H01L 2924/01074* (2013.01); *H01L 2924/04941* (2013.01); *H01L 2924/181* (2013.01)

(58) Field of Classification Search
CPC ......... H01L 24/45; H01L 24/48; H01L 24/49; H01L 24/73; H01L 24/83; H01L 23/3114; H01L 23/49548; H01L 23/49582; H01L 23/5226; H01L 23/5283; H01L 23/3107; H01L 23/53238; H01L 23/562
See application file for complete search history.

(56) References Cited

U.S. PATENT DOCUMENTS

| | | |
|---|---|---|
| 2008/0277788 A1 | 11/2008 | Matsumori |
| 2010/0164105 A1 | 7/2010 | Onai et al. |
| 2015/0263279 A1* | 9/2015 | Hayakawa ............ H01L 45/146 257/4 |
| 2016/0181184 A1 | 6/2016 | Matsumoto et al. |

FOREIGN PATENT DOCUMENTS

| | | |
|---|---|---|
| JP | 2012114148 A | 6/2012 |
| JP | 2014022505 A | 2/2014 |
| JP | 2016115892 A | 6/2016 |
| WO | 2012176392 A1 | 12/2012 |

* cited by examiner

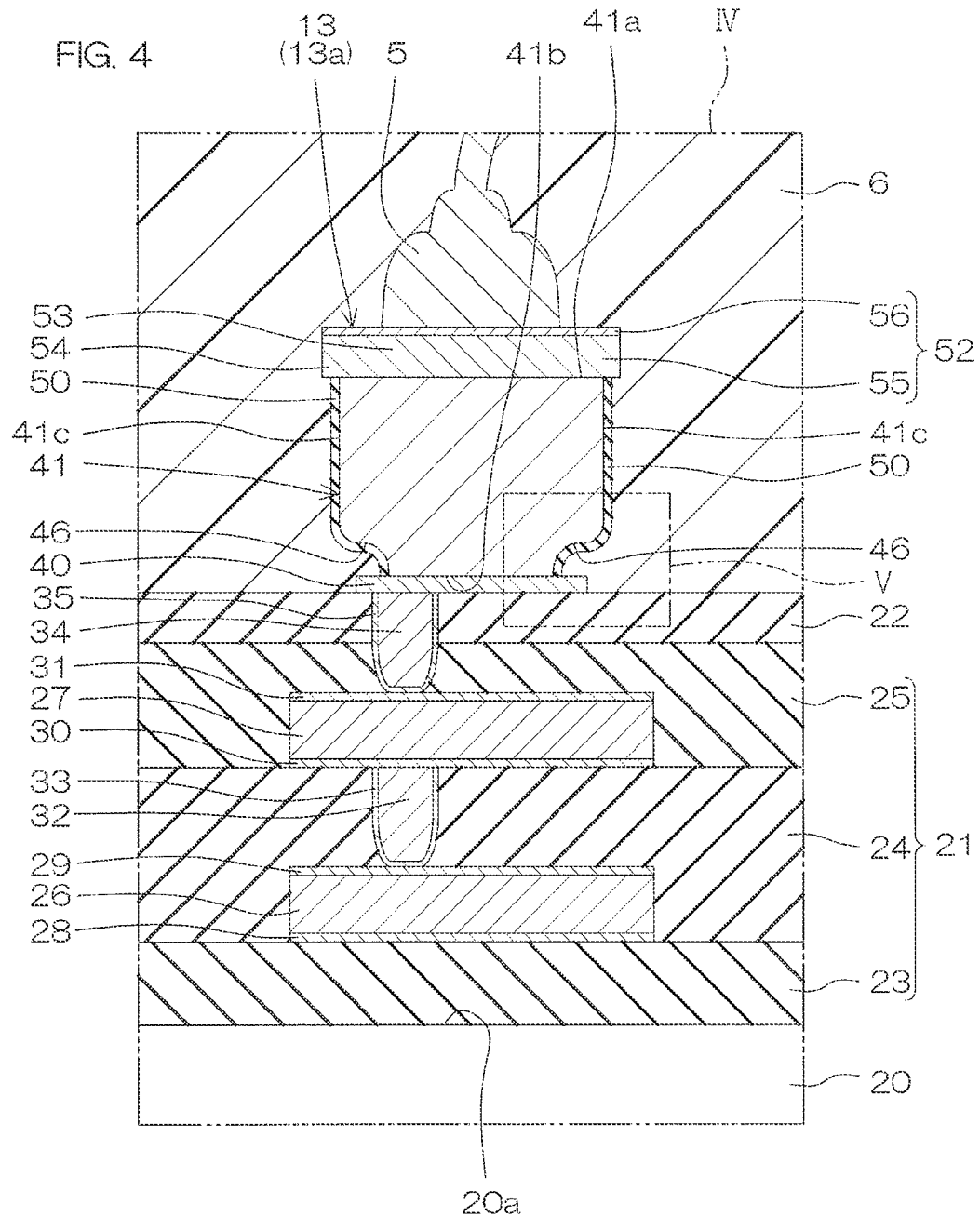

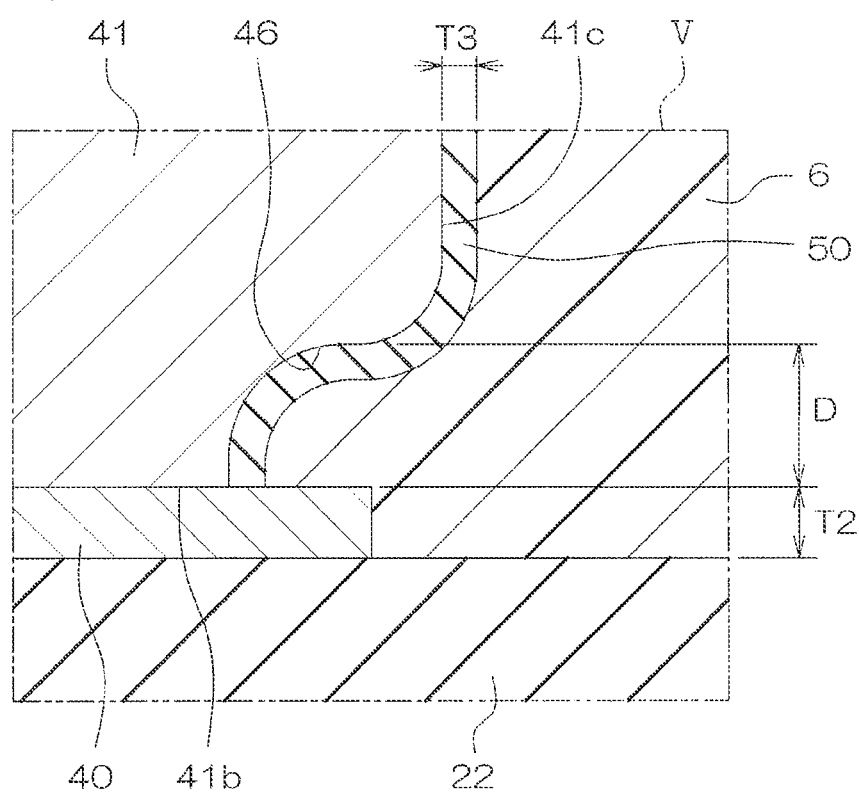

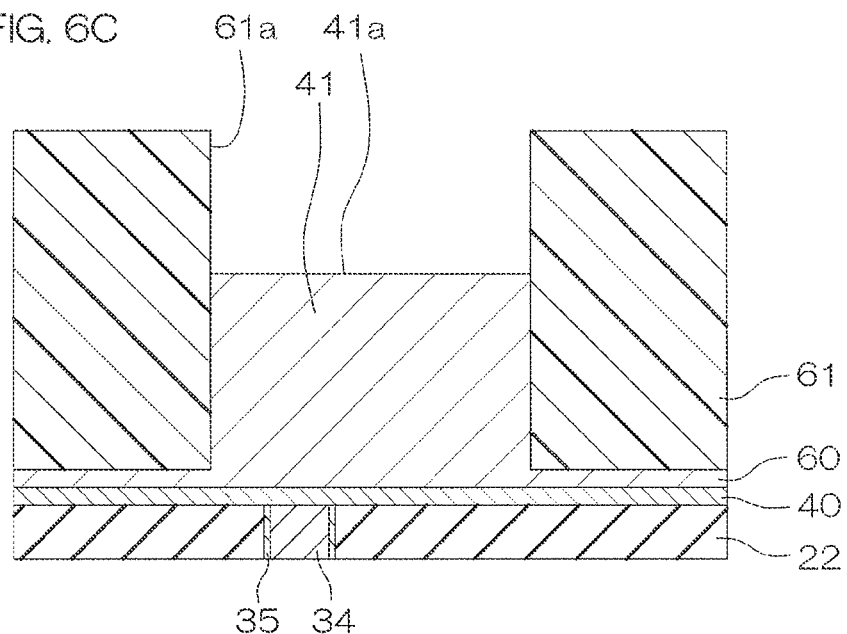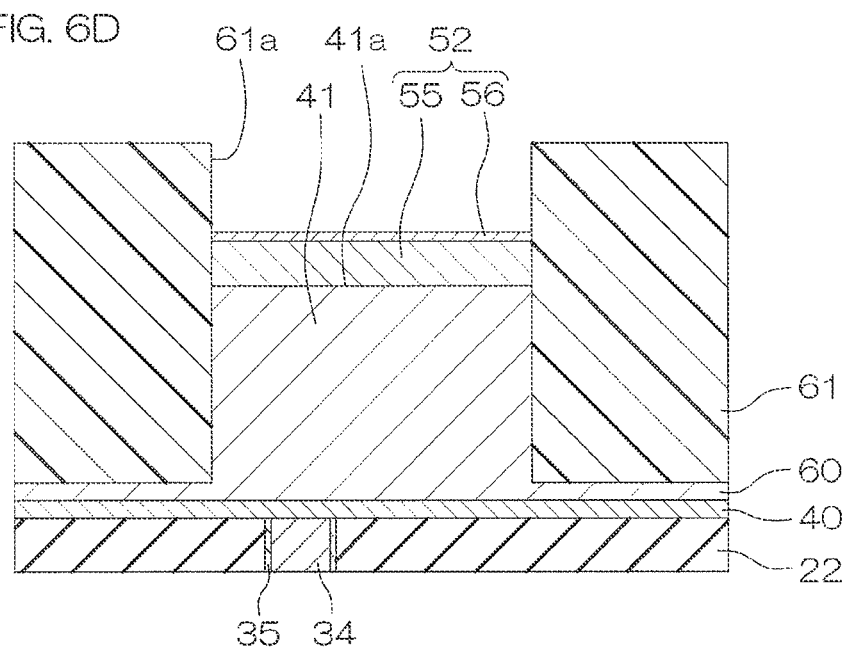

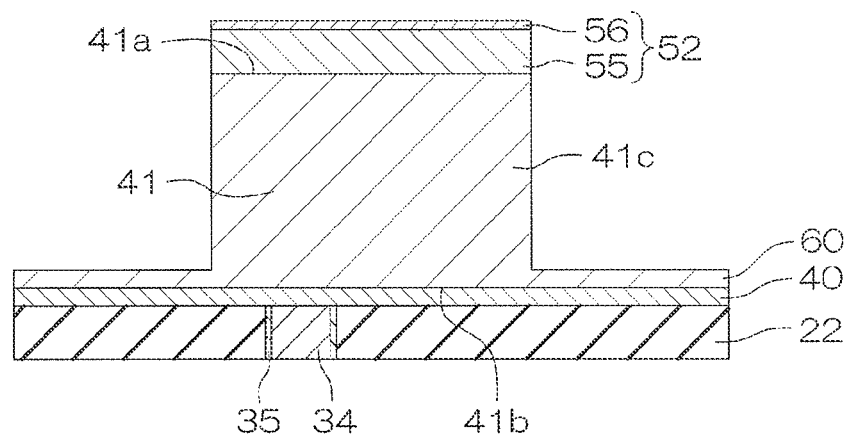
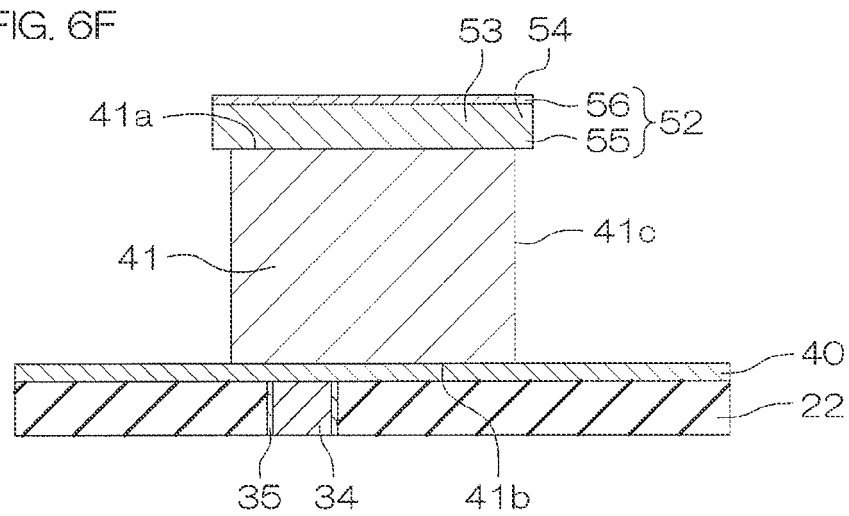

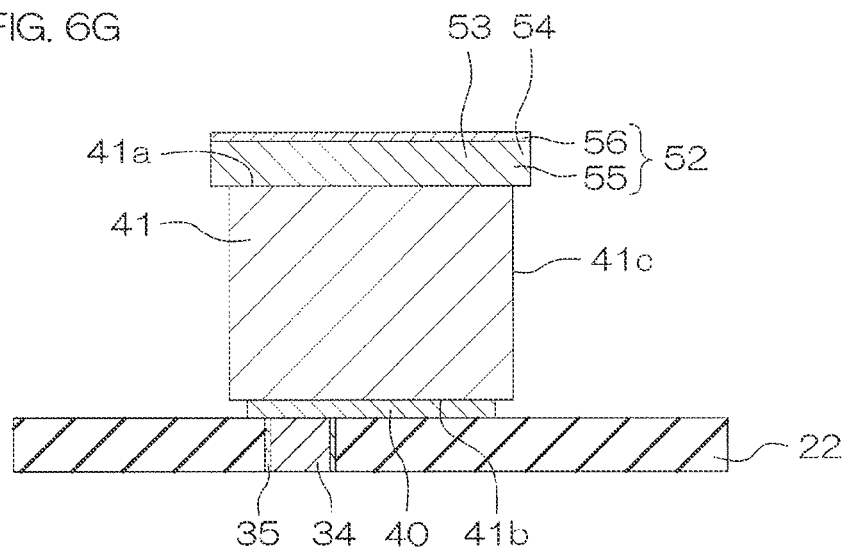
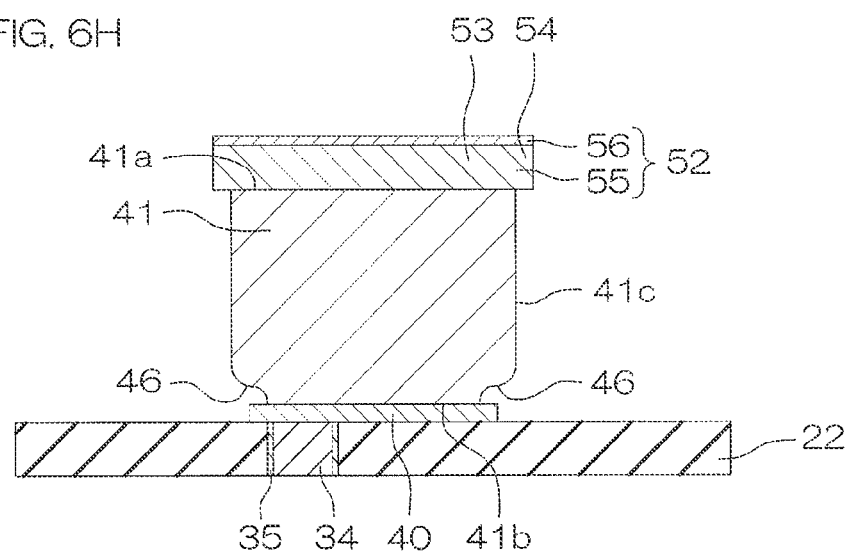

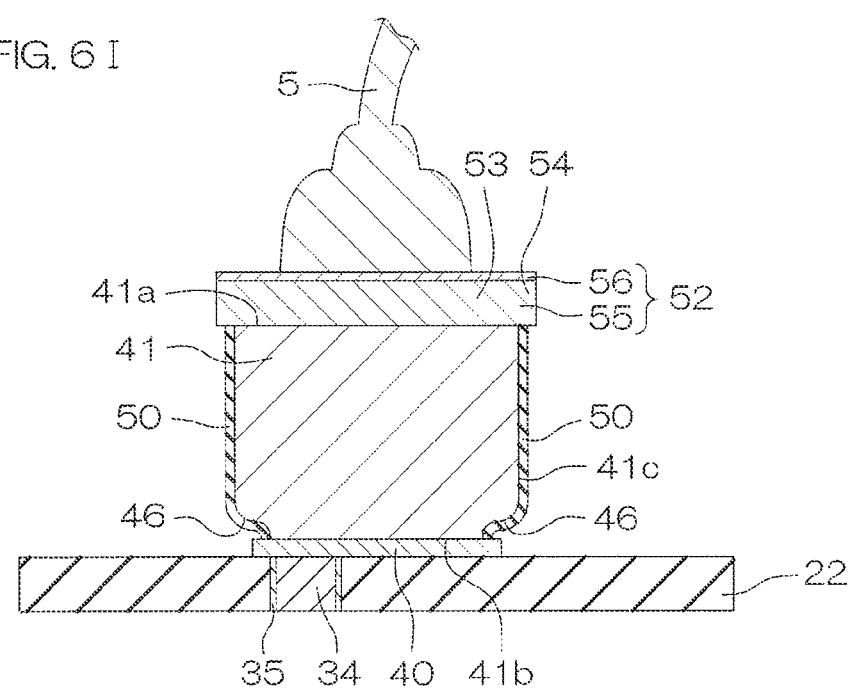

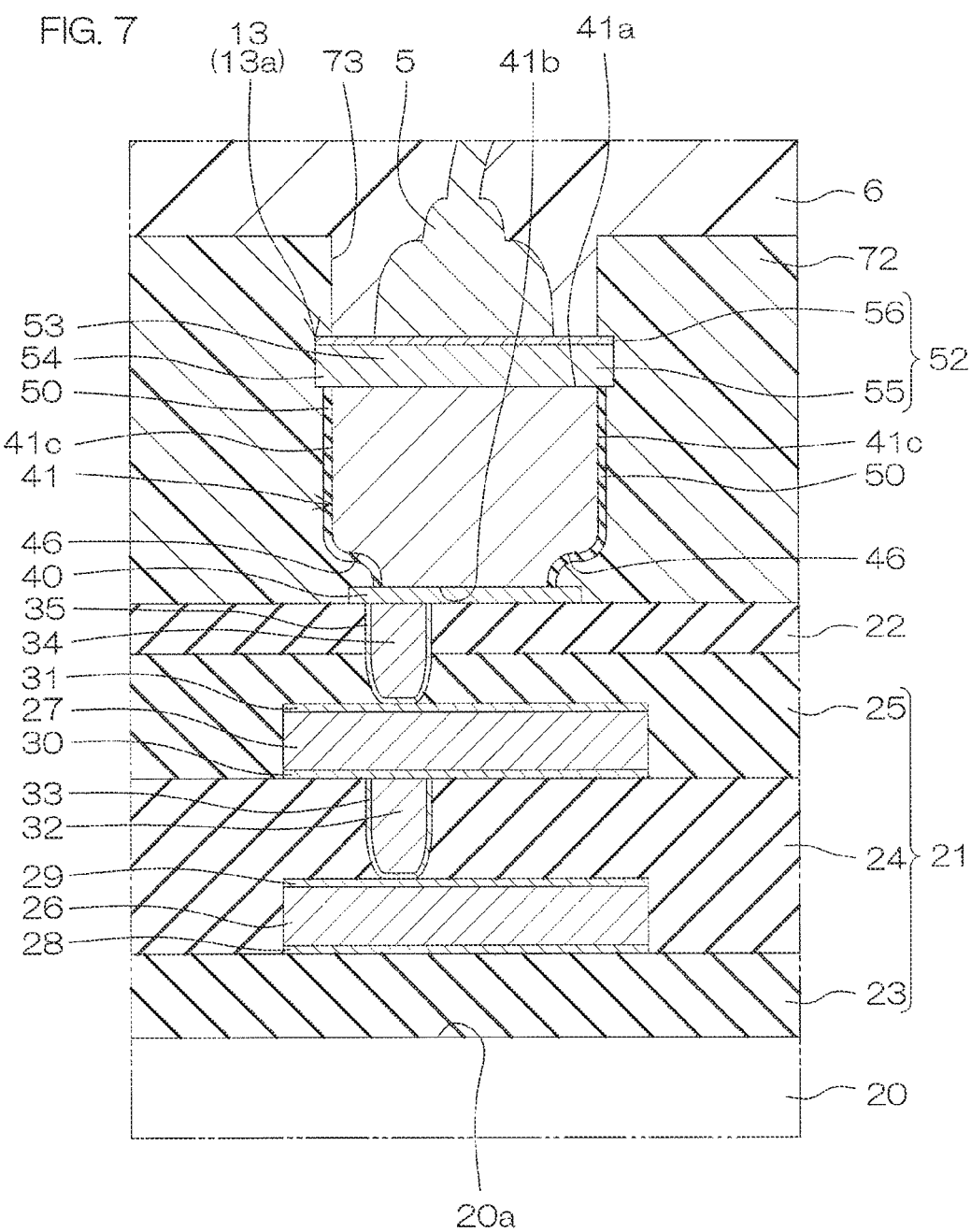

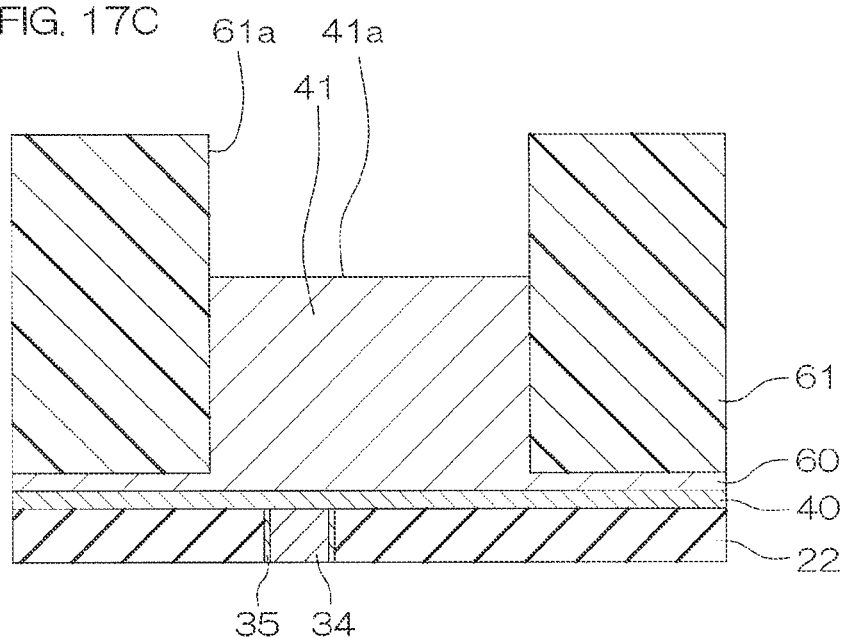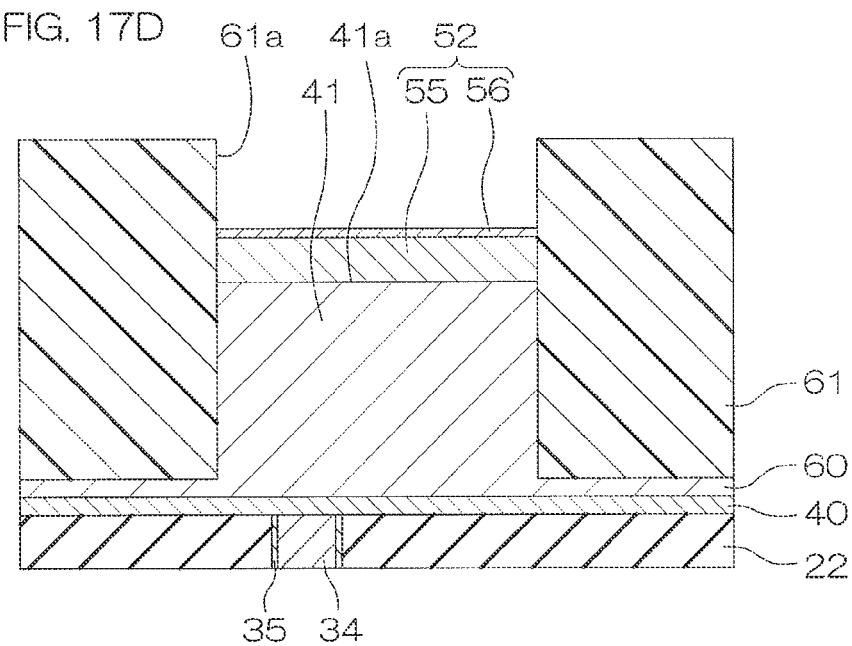

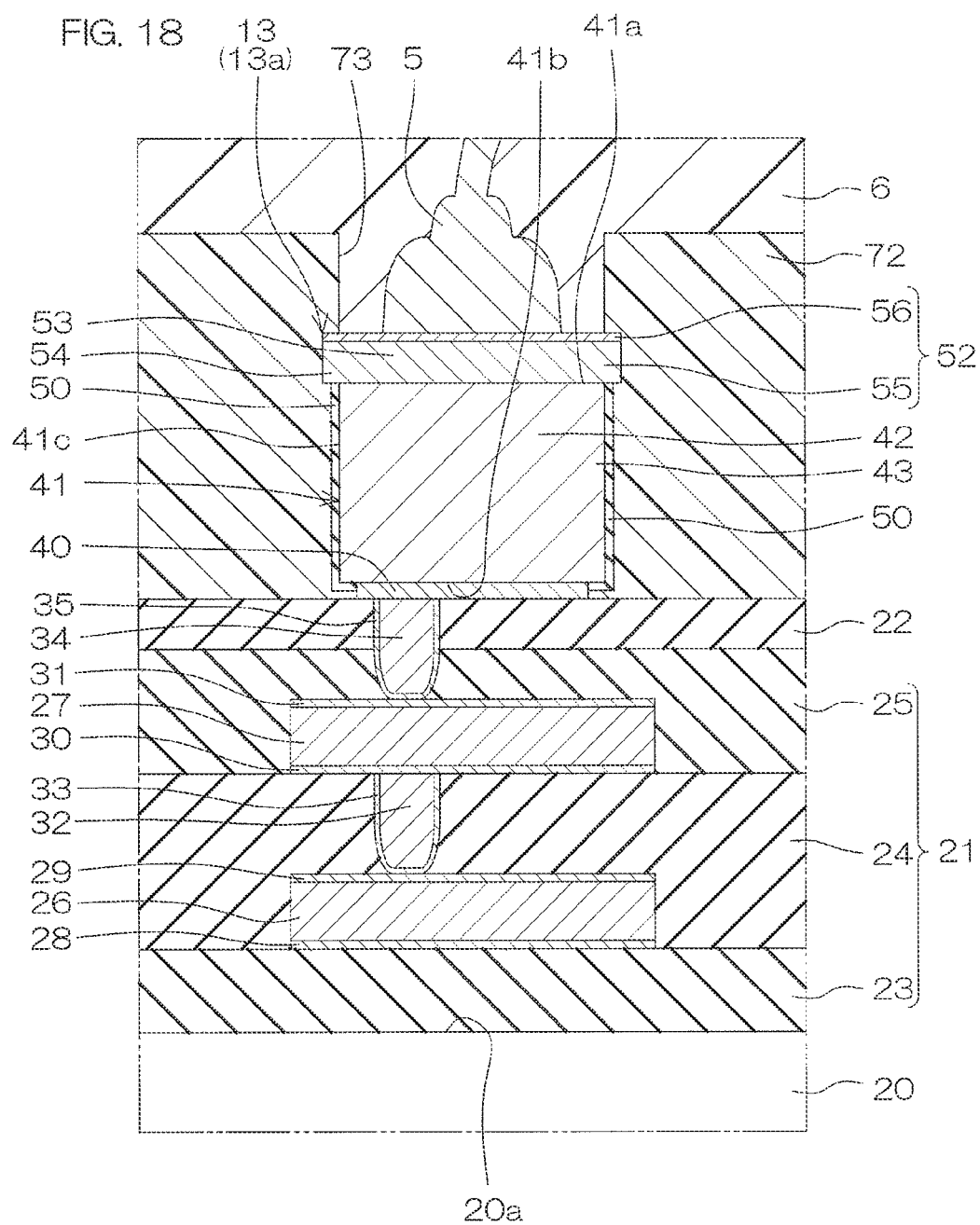

SEMICONDUCTOR DEVICE

CROSS-REFERENCE TO RELATED APPLICATIONS

This application is a continuation of U.S. patent application Ser. No. 16/842,548 filed Apr. 7, 2020, entitled SEMICONDUCTOR DEVICE, which is a continuation of U.S. patent application Ser. No. 16/561,747, filed Sep. 5, 2019, entitled SEMICONDUCTOR DEVICE, issued as U.S. Pat. No. 10,651,144 on May 12, 2020, which is a continuation of U.S. patent application Ser. No. 15/717,449, filed Sep. 27, 2017, entitled SEMICONDUCTOR DEVICE, issued as U.S. Pat. No. 10,453,816 on Oct. 22, 2019, which claims priority to benefit Japanese Application No. 2017-177980, filed Sep. 15, 2017, Japanese Application No. 2016-190019, filed Sep. 28, 2016, and Japanese Application No. 2016-190018, filed Sep. 28, 2016, the specifications of which are incorporated by reference herein in their entirety.

TECHNICAL FIELD

The present invention relates to a semiconductor device.

BACKGROUND

US2010/164105A1 discloses a semiconductor device that includes a semiconductor substrate, an insulating film formed on the semiconductor substrate, and a copper wiring formed on the insulating film.

SUMMARY

A preferred embodiment of the present invention provides a semiconductor device that includes an insulating layer, a barrier electrode layer formed on the insulating layer, a Cu electrode layer that includes a metal composed mainly of copper and that is formed on a principal surface of the barrier electrode layer, and an outer-surface insulating film that includes copper oxide, that coats an outer surface of the Cu electrode layer, and that is in contact with the principal surface of the barrier electrode layer.

A preferred embodiment of the present invention provides a semiconductor device that includes an insulating layer, a barrier electrode layer formed on the insulating layer, a Cu electrode layer that includes a metal composed mainly of copper and that is formed on a principal surface of the barrier electrode layer, a resin film with which an outer surface of the Cu electrode layer is coated and that is in contact with the principal surface of the barrier electrode layer, and an outer-surface insulating film that is interposed between the Cu electrode layer and the resin film.

The aforementioned or other objects, features, and effects of the present invention will be clarified by the following description of preferred embodiments given below with reference to the accompanying drawings.

BRIEF DESCRIPTION OF THE DRAWINGS

For a more complete understanding, reference is now made to the following description taken in conjunction with the accompanying Drawings in which:

FIG. 4 is an enlarged view of region IV of FIG. 3.

FIG. 5 is an enlarged view of region V of FIG. 4.

FIG. 6A to FIG. 6I are views to describe a process for manufacturing a wiring layer of FIG. 4.

FIG. 7 is an enlarged view of a part corresponding to FIG. 4, showing a wiring layer of a semiconductor device and a structure therearound according to a second preferred embodiment of the present invention.

FIG. 17A to FIG. 17H are views to describe a process for manufacturing a wiring layer of FIG. 15.

FIG. 18 is an enlarged view of a part corresponding to FIG. 15, showing a wiring layer of a semiconductor device and a structure therearound according to a fifth preferred embodiment of the present invention.

DETAILED DESCRIPTION

Figure 1:
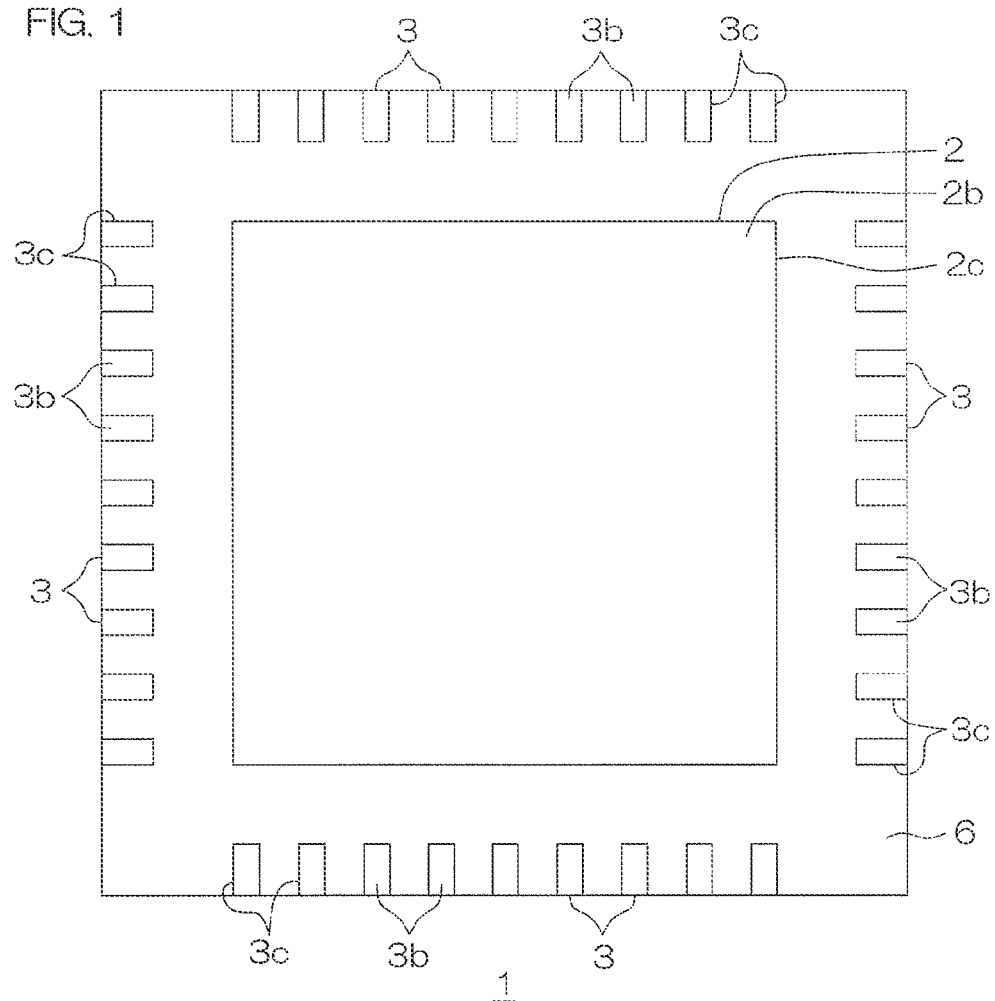
FIG. 1 is a bottom view showing a semiconductor device according to a first preferred embodiment of the present invention.

The present inventors have studied a semiconductor device that has a structure in which a Cu electrode layer is formed on an insulating layer with a barrier electrode layer therebetween. However, in this structure, there is a case in which a crack occurs near a peripheral edge of the barrier electrode layer in the insulating layer. The present inventors have found out the fact that part of the cause lies in an outer-surface insulating film including copper oxide that is formed on an outer surface of the Cu electrode layer.

There is a case in which the outer-surface insulating film is formed so as to come into contact with an insulating layer near the peripheral edge of the barrier electrode layer although, from an idealistic viewpoint, the outer-surface insulating film is formed only on the outer surface of the Cu electrode layer. In the thus formed structure, when the semiconductor device is heated so that the thermal expansion of the Cu electrode layer and the thermal expansion of the outer-surface insulating film occur, a load caused by the thermal expansion of the Cu electrode layer, in addition to a load caused by the thermal expansion of the outer-surface insulating film, is applied to the insulating layer through the outer-surface insulating film. As a result, stress is concentrated in the vicinity of the peripheral edge of the barrier electrode layer in the insulating layer, and a crack occurs.

Therefore, a preferred embodiment of the present invention provides a semiconductor device that is capable of restraining a crack from occurring in an insulating layer placed below a Cu electrode layer.

A preferred embodiment of the present invention provides a semiconductor device that includes an insulating layer, a barrier electrode layer formed on the insulating layer, a Cu electrode layer that includes a metal composed mainly of copper and that is formed on a principal surface of the barrier electrode layer, and an outer-surface insulating film that includes copper oxide, that coats an outer surface of the Cu electrode layer, and that is in contact with the principal surface of the barrier electrode layer.

In this semiconductor device, the outer-surface insulating film that coats the outer surface of the Cu electrode layer is formed so as to come into contact with the principal surface of the barrier electrode layer. Therefore, it is possible to restrain a load from being applied directly onto the insulating layer from the Cu electrode layer or from the outer-surface insulating film.

Accordingly, it is possible to restrain a load from being applied from the outer-surface insulating film to the insulating layer, and it is possible to restrain a load from being applied from the Cu electrode layer to the insulating layer through the outer-surface insulating film. Therefore, it is possible to restrain stress from being applied to the insulating layer placed below the Cu electrode layer, and therefore it is possible to provide a semiconductor device capable of restraining a crack from occurring in the insulating layer placed below the Cu electrode layer.

A preferred embodiment of the present invention provides a semiconductor device that includes an insulating layer, a barrier electrode layer formed on the insulating layer, a Cu electrode layer that includes a metal composed mainly of copper and that is formed on a principal surface of the barrier electrode layer, a resin film with which an outer surface of the Cu electrode layer is coated and that is in contact with the principal surface of the barrier electrode layer, and an outer-surface insulating film that is interposed between the Cu electrode layer and the resin film.

In this semiconductor device, a resin film with which the outer surface of the Cu electrode layer is coated through the outer-surface insulating film is formed. With this resin film, it is possible to restrain the outer surface of the Cu electrode layer from coming into contact with open air, and therefore it is possible to restrain copper oxide (outer-surface insulating film) from being formed on the outer surface of the Cu electrode layer. This makes it possible to restrain the outer-surface insulating film from being thickened, and hence makes it possible to restrain a load from being caused by the thermal expansion of the outer-surface insulating film.

Furthermore, the resin film is formed so as to come into contact with the principal surface of the barrier electrode layer, and therefore the outer-surface insulating film formed between the Cu electrode layer and the resin film is formed on the principal surface of the barrier electrode layer. Therefore, it is possible to restrain a load from being applied directly onto the insulating layer from the Cu electrode layer or from the outer-surface insulating film.

Therefore, it is possible to restrain a load from being applied from the outer-surface insulating film to the insulating layer, and it is possible to restrain a load from being applied from the Cu electrode layer to the insulating layer through the outer-surface insulating film. Therefore, it is possible to restrain stress from being applied onto the insulating layer placed below the Cu electrode layer, and therefore it is possible to provide a semiconductor device capable of restraining a crack from occurring in the insulating layer placed below the Cu electrode layer.

Preferred embodiments of the present invention will be hereinafter described in detail with reference to the accompanying drawings.

Figure 2:
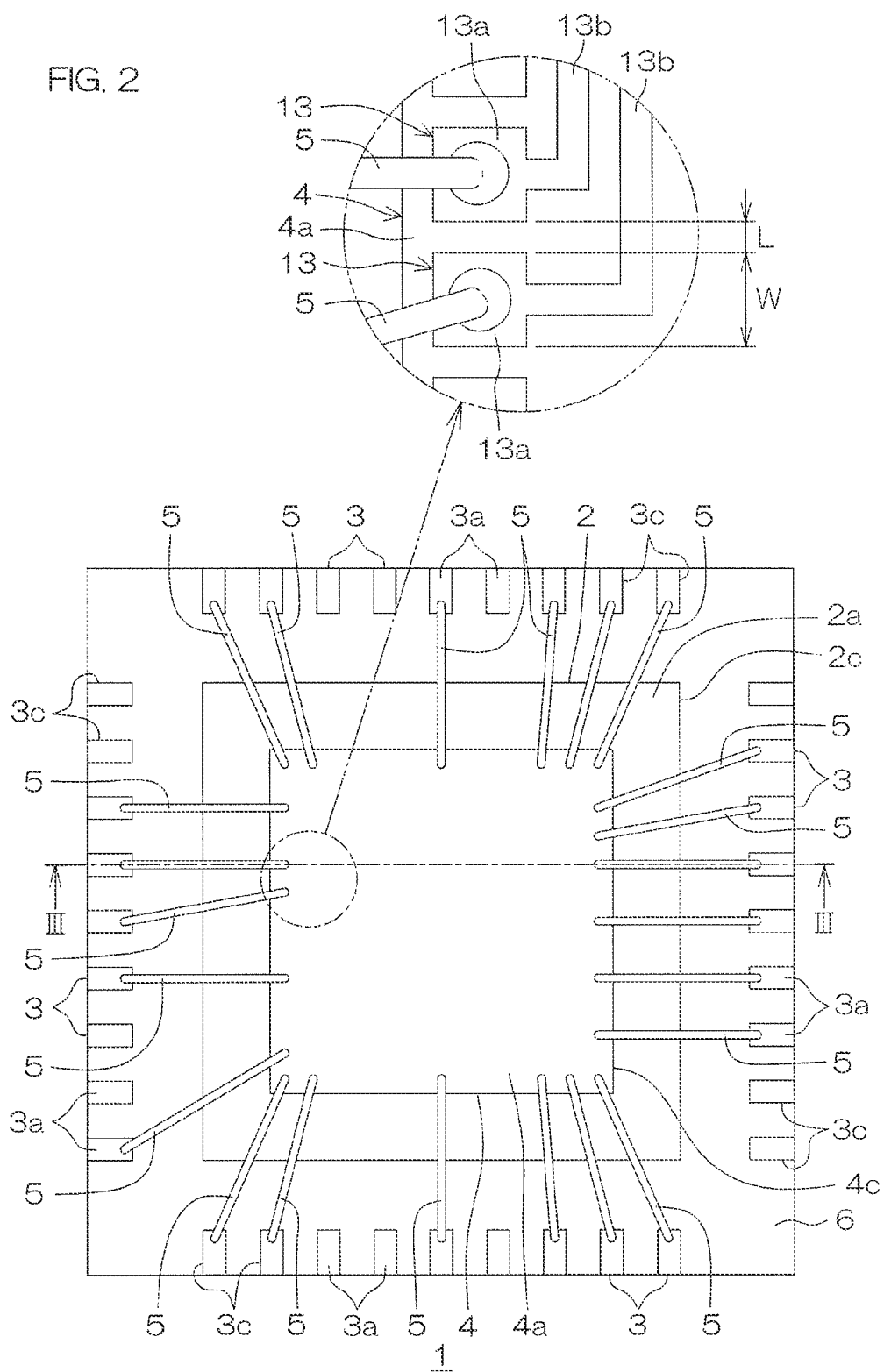
FIG. 2 is a plan view showing an internal structure of the semiconductor device of FIG. 1.
Figure 3:
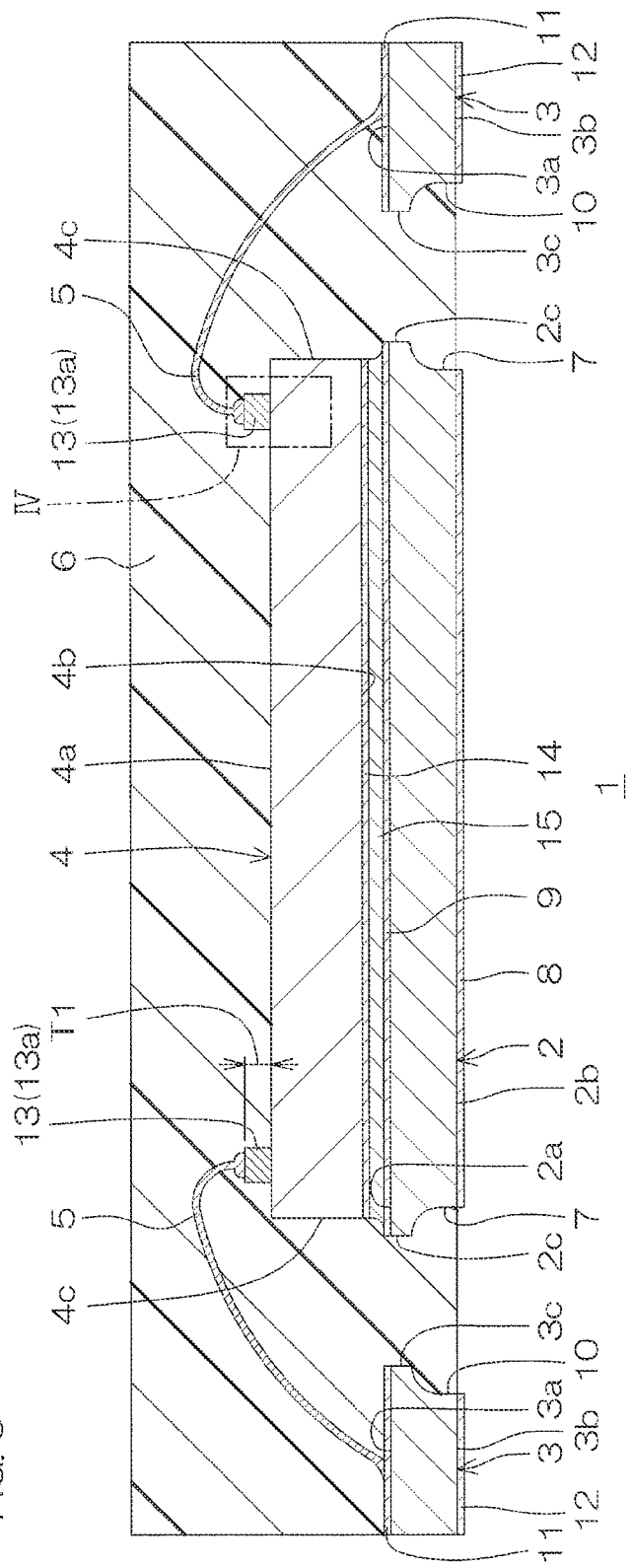
FIG. 3 is a cross-sectional view along line of FIG. 2.

FIG. 1 is a bottom view showing a semiconductor device 1 according to a first preferred embodiment of the present invention. FIG. 2 is a plan view showing an internal structure of the semiconductor device 1 of FIG. 1. FIG. 3 is a cross-sectional view along line of FIG. 2.

The semiconductor device 1 is a semiconductor device to which QFN (Quad Flat Non-leaded Package) is applied as a form of a semiconductor package.

Referring to FIG. 1 to FIG. 3, the semiconductor device 1 includes a die pad 2, lead terminals 3, a semiconductor chip 4, bonding wires 5 (wires), and a sealing resin 6 that seals up those elements. The sealing resin 6 may include an epoxy resin. The sealing resin 6 is formed in a flat rectangular parallelepiped shape.

The die pad 2 includes a first principal surface 2a, a second principal surface 2b on the side opposite to the first principal surface 2a, and a side surface 2c that connects the first principal surface 2a and the second principal surface 2b. The die pad 2 is formed in a quadrilateral shape in a plan view as viewed from a normal direction of the first principal surface 2a (hereinafter, referred to simply as "in the plan view"). A recess portion 7 that is hollowed from a second-principal-surface-2b side toward a first-principal-surface-2a side is formed at a peripheral edge portion on the second-principal-surface-2b side of the die pad 2 over its entire periphery.

The sealing resin 6 is formed so as to enter the recess portion 7 of the die pad 2. This restrains the die pad 2 from falling off the sealing resin 6. The second principal surface 2b of the die pad 2 is exposed from the sealing resin 6 except for a part in which the recess portion 7 is formed. A silver plating film 8 is formed on the first principal surface 2a of the die pad 2. On the other hand, a solder plating film 9 is formed on the second principal surface 2b of the die pad 2 exposed from the sealing resin 6.

A plurality of lead terminals each of which is the lead terminal 3 are arranged around the die pad 2. More specifically, the lead terminal 3 is provided such that a plurality of lead terminals (nine lead terminals in the present preferred embodiment) are arranged at each position that faces each of the side surfaces 2c of the die pad 2 in the present preferred embodiment.

The lead terminals 3 that face the single side surface 2c of the die pad 2 are evenly spaced out along the single side surface 2c, and are each formed in a rectangular parallelepiped shape that extends in a direction perpendicular to the single side surface 2c.

The lead terminal 3 includes a first principal surface 3a, a second principal surface 3b on the side opposite to the first principal surface 3a, and a side surface 3c that connects the first principal surface 3a and the second principal surface 3b. A recess portion 10 that is hollowed from a second-principal-surface-3b side toward a first-principal-surface-3a side is formed at the second principal surface 3b of the lead terminal 3.

The recess portion 10 of the lead terminal 3 is formed at an end part of the die-pad-2 side in the lead terminal 3. The sealing resin 6 is formed so as to enter the recess portion 10 of the lead terminal 3. This restrains the lead terminal 3 from falling off the sealing resin 6.

The second principal surface 3b of the lead terminal 3 is exposed from the sealing resin 6 except for a part in which the recess portion 10 is formed. A silver plating film 11 is formed on the first principal surface 3a of the lead terminal 3. A solder plating film 12 is formed on the second principal surface 3b of the lead terminal 3 exposed from the sealing resin 6.

The semiconductor chip 4 is formed in a quadrilateral shape in the plan view, and includes a first principal surface 4a, a second principal surface 4b positioned on the side opposite to the first principal surface 4a, and a side surface 4c that connects the first principal surface 4a and the second principal surface 4b. A plurality of wiring layers 13 are formed on the first principal surface 4a of the semiconductor chip 4. A metal film 14 with which the second principal surface 4b is coated is formed on the second principal surface 4b of the semiconductor chip 4.

The wiring layers 13 are formed on the first principal surface 4a of the semiconductor chip 4 as to be separated from each other with intervals therebetween. Each wiring layer 13 integrally includes a pad portion 13a connected mechanically and electrically to the bonding wire 5 and a drawn portion 13b drawn out from the pad portion 13a to other regions provided on a passivation film 22. The pad portion 13a of each wiring layer 13 is formed in a quadrilateral shape in the plan view in the present preferred embodiment.

Referring to FIG. 2 and FIG. 3, the width W of the pad portion 13a may be equal to or larger than 5 μm and equal to or smaller than 300 μm. The thickness T1 of the pad portion 13a may be equal to or larger than 3 μm and equal to or smaller than 25 μm. The aspect ratio R of the pad portion 13a (=thickness T1/width W) may be $0<R\leq 1$. The distance L between the pad portions 13a that adjoin each other may be equal to or smaller than 20 μm.

The metal film 14 formed on the second principal surface 4b of the semiconductor chip 4 is joined to the first principal surface 2a (the silver plating film 8) of the die pad 2 through a metallic junction material 15. The junction material 15 may be a solder or may be a metallic paste material.

The semiconductor chip 4 is supported by the die pad 2 in a posture in which the first principal surface 4a is directed upward. In a case in which the semiconductor chip 4 and the die pad 2 are not required to be electrically connected, the semiconductor chip 4 and the die pad 2 may be joined by use of a junction material made of an insulating material instead of the metallic junction material 15. In this case, the silver plating film 8 may be excluded from the first principal surface 2a of the die pad 2.

The wiring layer 13 formed on the first principal surface 4a of the semiconductor chip 4 is electrically connected to the lead terminal 3 corresponding thereto through the bonding wire 5. The bonding wire 5 may include aluminum, copper, or gold.

FIG. 4 is an enlarged view of region IV of FIG. 3. FIG. 5 is an enlarged view of region V of FIG. 4.

Referring to FIG. 4, the semiconductor chip 4 includes a semiconductor substrate 20, a multilayer wiring structure 21, a passivation film 22 (insulating layer), and the plurality of wiring layers 13. In FIG. 4, only the pad portion 13a of the single wiring layer 13 among the wiring layers 13 is shown.

The semiconductor substrate 20 may be a silicon substrate. The semiconductor substrate 20 has a device-forming surface 20a on which a functional device is formed. A diode, a transistor, a resistor, a capacitor, etc., can be mentioned as examples of the functional device formed on the device-forming surface 20a.

The multilayer wiring structure 21 includes a plurality of interlayer insulating films 23, 24, and 25 formed on the device-forming surface 20a of the semiconductor substrate 20 and a plurality of electrode layers 26 and 27 formed inside the interlayer insulating films 23, 24, and 25.

The interlayer insulating films 23, 24, and 25 include a first interlayer insulating film 23 formed on the device-forming surface 20a of the semiconductor substrate 20, a second interlayer insulating film 24 formed on the first interlayer insulating film 23, and a third interlayer insulating film 25 formed on the second interlayer insulating film 24. The first interlayer insulating film 23, the second interlayer insulating film 24, and the third interlayer insulating film 25 may each include an oxide film ($SiO_2$ film) or a nitride film (SiN film).

The electrode layers 26 and 27 include a first electrode layer 26 that is formed on the first interlayer insulating film 23 and that is coated with the second interlayer insulating film 24 and a second electrode layer 27 that is formed on the second interlayer insulating film 24 and that is coated with the third interlayer insulating film 25. The first electrode layer 26 and the second electrode layer 27 may each include copper or aluminum.

A first lower surface barrier electrode layer 28 is formed on a lower surface of the first electrode layer 26. The first lower surface barrier electrode layer 28 restrains an electrode material of which the first electrode layer 26 is made from diffusing into the first interlayer insulating film 23.

A first upper surface barrier electrode layer 29 is formed on an upper surface of the first electrode layer 26. The first upper surface barrier electrode layer 29 restrains an electrode material of which the first electrode layer 26 is made from diffusing into the second interlayer insulating film 24.

A second lower surface barrier electrode layer 30 is formed on a lower surface of the second electrode layer 27. The second lower surface barrier electrode layer 30 restrains an electrode material of which the second electrode layer 27 is made from diffusing into the second interlayer insulating film 24.

A second upper surface barrier electrode layer 31 is formed on an upper surface of the second electrode layer 27. The second upper surface barrier electrode layer 31 restrains an electrode material of which the second electrode layer 27 is made from diffusing into the third interlayer insulating film 25.

The first lower surface barrier electrode layer 28 and the second lower surface barrier electrode layer 30 may have a single-layer structure consisting of a titanium nitride layer or of a titanium layer, or may have a laminated structure including a titanium nitride layer and a titanium layer formed on the titanium nitride layer.

The first upper surface barrier electrode layer 29 and the second upper surface barrier electrode layer 31 may have a single-layer structure consisting of a titanium nitride layer or of a titanium layer, or may have a laminated structure including a titanium nitride layer and a titanium layer formed on the titanium nitride layer.

The passivation film 22 is formed on the multilayer wiring structure 21 so as to coat the multilayer wiring structure 21. More specifically, the passivation film 22 is formed on the third interlayer insulating film 25 so as to coat the third interlayer insulating film 25.

The passivation film 22 may include an oxide film ($SiO_2$ film), a BPSG (Boron Phosphorus Silicon Glass) film, or a nitride film (SiN film). The passivation film 22 may have a laminated structure including a nitride film (SiN film) and an oxide film ($SiO_2$ film) that are laminated from the surface of the third interlayer insulating film 25 in this order. The passivation film 22 is a nitride film (SiN film) in the present preferred embodiment.

A first via electrode 32 that passes through the second interlayer insulating film 24 is formed in the second interlayer insulating film 24 between the upper surface of the first electrode layer 26 and the lower surface of the second electrode layer 27. The first electrode layer 26 is electrically connected to the second electrode layer 27 through the first via electrode 32.

A first barrier electrode film 33 is formed between the first via electrode 32 and the second interlayer insulating film 24. The first via electrode 32 may include tungsten. The first barrier electrode film 33 may include titanium nitride.

A second via electrode 34 that passes through the passivation film 22 and through the third interlayer insulating film 25 is formed in the passivation film 22 and the third interlayer insulating film 25 that are above the upper surface of the second electrode layer 27. The second via electrode 34 is exposed from the passivation film 22, and is electrically connected to the second electrode layer 27.

An exposed surface of the second via electrode 34 is formed so as to be flush with the surface of the passivation film 22. A second barrier electrode film 35 is formed between the second via electrode 34 and the third interlayer insulating film 25 and between the second via electrode 34 and the passivation film 22. The second via electrode 34 may include tungsten. The second barrier electrode film 35 may include titanium nitride.

The wiring layer 13 is formed on the passivation film 22 so as to coat the second via electrode 34. The wiring layer 13 has a laminated structure including a barrier electrode layer 40 formed on the passivation film 22 and a Cu electrode layer 41 that includes a metal composed mainly of copper and that is formed on a principal surface of the barrier electrode layer 40. The barrier electrode layer 40 restrains an electrode material of which the Cu electrode layer 41 is made from diffusing into the passivation film 22.

The term "metal composed mainly of copper" denotes a metal in which the mass ratio (mass %) of copper that is a component of the Cu electrode layer 41 is the highest with respect to other components of the Cu electrode layer 41 (the same applies hereinafter). In a case in which the Cu electrode layer 41 is made of an aluminum copper alloy (Al—Cu alloy), the mass ratio $R_{Cu}$ of copper is higher than the mass ratio $R_{Al}$ of aluminum ($R_{Cu}$>$R_{Al}$).

In a case in which the Cu electrode layer 41 is made of an aluminum-silicon-copper alloy (Al—Si—Cu alloy), the mass ratio $R_{Cu}$ of copper is higher than the mass ratio $R_{Al}$ of aluminum, and is higher than the mass ratio $R_{Si}$ of silicon ($R_{Cu}$>$R_{Al}$ and $R_{Cu}$>$R_{Si}$).

Although there is a case in which the "metal composed mainly of copper" includes a slight amount of impurities, it includes high-purity copper, such as high-purity copper whose purity is equal to or more than 99.9999% (6N) or high-purity copper whose purity is equal to or more than 99.99% (4N).

The barrier electrode layer 40 is formed on the passivation film 22 so as to coat the second via electrode 34. The barrier electrode layer 40 is electrically connected to the first electrode layer 26 and the second electrode layer 27 through the second via electrode 34.

The barrier electrode layer 40 may have a thickness of equal to or larger than 100 nm and equal to or smaller than 500 nm (e.g. about 100 nm). The barrier electrode layer 40 may have a single-layer structure consisting of a single metallic layer. The barrier electrode layer 40 may have a laminated structure in which a plurality of metallic layers are laminated.

Preferably, the barrier electrode layer 40 has a coefficient of thermal expansion smaller than that of the Cu electrode layer 41. Additionally, preferably, the barrier electrode layer 40 has a modulus of rigidity larger than that of the Cu electrode layer 41.

The barrier electrode layer 40 may include at least one kind of titanium, titanium nitride, tantalum, tungsten, molybdenum, chrome, or ruthenium. With these metallic materials, it is possible to realize the barrier electrode layer 40 that has a coefficient of thermal expansion (equal to or larger than 4 μm/m·K and equal to or smaller than 9 μm/m·K) smaller than that of the Cu electrode layer 41. In a case in which the Cu electrode layer 41 is made of high-purity copper, the coefficient of thermal expansion of the Cu electrode layer 41 is about 16.5 μm/m·K.

The barrier electrode layer 40 may include at least one kind of tantalum, tungsten, molybdenum, chrome, or ruthenium. With these metallic materials, it is possible to realize the barrier electrode layer 40 that has a coefficient of thermal expansion (equal to or larger than 4 μm/m·K and equal to or smaller than 7 μm/m·K) smaller than that of the Cu electrode layer 41.

Additionally, with these metallic materials, it is possible to realize the barrier electrode layer 40 that has a modulus of rigidity (equal to or larger than 50 Gpa and equal to or smaller than 180 Gpa) larger than that of the Cu electrode layer 41. In a case in which the Cu electrode layer 41 is made of high-purity copper, the modulus of rigidity of the Cu electrode layer 41 is about 48 Gpa.

Referring to FIG. 4 and FIG. 5, the Cu electrode layer 41 occupies most of the wiring layer 13. The Cu electrode layer 41 may have a thickness of equal to or larger than 3 μm and equal to or smaller than 20 μm. The Cu electrode layer 41 has an upper surface 41a (first surface), a lower surface 41b (second surface) positioned on the side opposite to the upper surface 41a, and a side surface 41c that connects the upper surface 41a and the lower surface 41b. The lower surface 41b of the Cu electrode layer 41 is mechanically and electrically connected to the barrier electrode layer 40.

A peripheral edge of the lower surface 41b of the Cu electrode layer 41 is formed at a position with an interval from a peripheral edge (side surface) of the barrier electrode layer 40 toward the inward side of the barrier electrode layer 40. The lower surface 41b of the Cu electrode layer 41 is formed so as to become narrower than the upper surface 41a of the Cu electrode layer 41 with respect to a direction along the surface of the passivation film 22.

More specifically, in the Cu electrode layer 41, a recess portion 46 that is hollowed toward the inside of the Cu electrode layer 41 and that exposes an upper surface of an edge portion of the barrier electrode layer 40 is formed in a region on the lower-surface-41b side of the side surface 41c.

The recess portion 46 is formed in a recessed curved shape toward the inside of the Cu electrode layer 41. As a result, the inner surface of the recess portion 46 is a recessed curved surface. The lower surface 41b of the Cu electrode layer 41 is formed so as to become narrower than the upper surface 41a of the Cu electrode layer 41 by means of the recess portion 46. Referring to FIG. 5, the width D of the recess portion 46 may be equal to or larger than 50 nm and equal to or smaller than 1000 nm with respect to a direction in which the Cu electrode layer 41 is laminated on the barrier electrode layer 40.

The side surface 41c of the Cu electrode layer 41 is positioned outside the peripheral edge (side surface) of the barrier electrode layer 40 in the present preferred embodiment. Therefore, the peripheral edge (side surface) of the barrier electrode layer 40 is positioned in a region between the peripheral edge of the lower surface 41b of the Cu electrode layer 41 and the side surface 41c of the Cu electrode layer 41 in the present preferred embodiment. The side surface 41c of the Cu electrode layer 41 may be positioned inside the peripheral edge (side surface) of the barrier electrode layer 40.

Referring to FIG. 4 and FIG. 5, an outer-surface insulating film 50 is formed on an outer surface of the Cu electrode layer 41 so as to coat the outer surface of the Cu electrode layer 41. The outer-surface insulating film 50 includes a natural oxide film formed by naturally oxidizing the copper constituting the Cu electrode layer 41.

Therefore, the outer-surface insulating film 50 includes copper oxide ($Cu_2O$ and/or $CuO$). Referring to FIG. 5, the outer-surface insulating film 50 has a thickness T3 smaller than a thickness T2 of the barrier electrode layer 40.

The outer-surface insulating film 50 coats the side surface 41c of the Cu electrode layer 41, and is brought into contact with the principal surface of the barrier electrode layer 40. The outer-surface insulating film 50 is in contact with the principal surface of the barrier electrode layer 40, and faces the passivation film 22 with the barrier electrode layer 40 therebetween at a position with an interval from the peripheral edge (side surface) of the barrier electrode layer 40 toward the inward side of the barrier electrode layer 40.

More specifically, the outer-surface insulating film 50 continuously extends from the side surface 41c of the Cu electrode layer 41 along the inner surface of the recess portion 46 formed at the side surface 41c, and is in contact with the principal surface of the barrier electrode layer 40 in the recess portion 46. In the outer-surface insulating film 50, its one surface and its other surface (surface on the Cu-electrode-layer-41 side) on the side opposite to the one surface are formed along the side surface 41c of the Cu electrode layer 41 and along the inner surface of the recess portion 46.

In the present preferred embodiment, the outer-surface insulating film 50 coats the whole area of the side surface 41c of the Cu electrode layer 41 including the inner surface of the recess portion 46. In the recess portion 46 of the Cu electrode layer 41, the principal surface of the barrier electrode layer 40 is exposed from the Cu electrode layer 41 and from the outer-surface insulating film 50.

Therefore, the outer-surface insulating film 50 is not in contact with the passivation film 22. The sealing resin 6 fills the recess portion 46 of the Cu electrode layer 41. The outer-surface insulating film 50 faces the principal surface of the barrier electrode layer 40 with the sealing resin 6 therebetween in the recess portion 46 of the Cu electrode layer 41.

The wiring layer 13 includes a pad electrode layer 52 formed on the upper surface 41a of the Cu electrode layer 41. The pad electrode layer 52 is formed on the upper surface 41a of the Cu electrode layer 41 so as to coat substantially the whole area of the upper surface 41a of the Cu electrode layer 41.

The pad electrode layer 52 includes a first part 53 mechanically and electrically connected to the upper surface 41a of the Cu electrode layer 41 and a second part 54 that protrudes from the first part 53 toward a lateral part of the Cu electrode layer 41. The pad electrode layer 52 is in contact with the outer-surface insulating film 50, i.e., more specifically, the second part 54 of the pad electrode layer 52 is in contact with the outer-surface insulating film 50.

The pad electrode layer 52 has a laminated structure including a nickel layer 55 formed on the upper surface 41a of the Cu electrode layer 41 and a palladium layer 56 formed on the nickel layer 55 in the present preferred embodiment. The palladium layer 56 is formed so as to have a thickness smaller than that of the nickel layer 55.

The thickness of the nickel layer 55 may be equal to or larger than 0.5 μm and equal to or smaller than 5 μm. The thickness of the palladium layer 56 may be equal to or larger than 0.05 μm and equal to or smaller than 2 μm. The bonding wire 5 is connected to the pad electrode layer 52 of the wiring layer 13.

FIG. 6A to FIG. 6I are views to describe a process for manufacturing the wiring layer 13 of FIG. 4. A case in which the Cu electrode layer 41 is made of high-purity copper will be hereinafter described as an example.

Figure 6A:
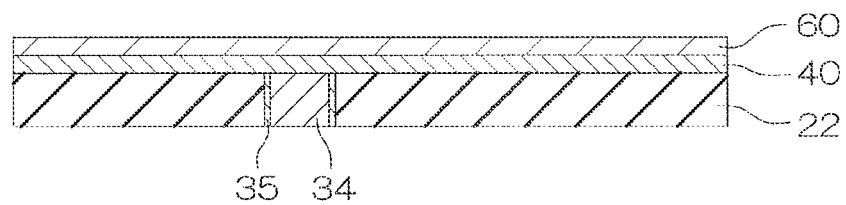

First, referring to FIG. 6A, the semiconductor substrate 20 (see FIG. 4 also) in which the passivation film 22 is formed on the multilayer wiring structure 21 is prepared. The second via electrode 34 that passes through the passivation film 22 and through the third interlayer insulating film 25 is formed in these films.

Thereafter, the barrier electrode layer 40 and the copper seed layer 60 are formed on the surface of the passivation film 22 in this order. The barrier electrode layer 40 and the copper seed layer 60 may be each formed according to a sputtering method. The barrier electrode layer 40 may be formed so as to have a thickness of equal to or larger than 100 nm and equal to or smaller than 500 nm.

Figure 6B:
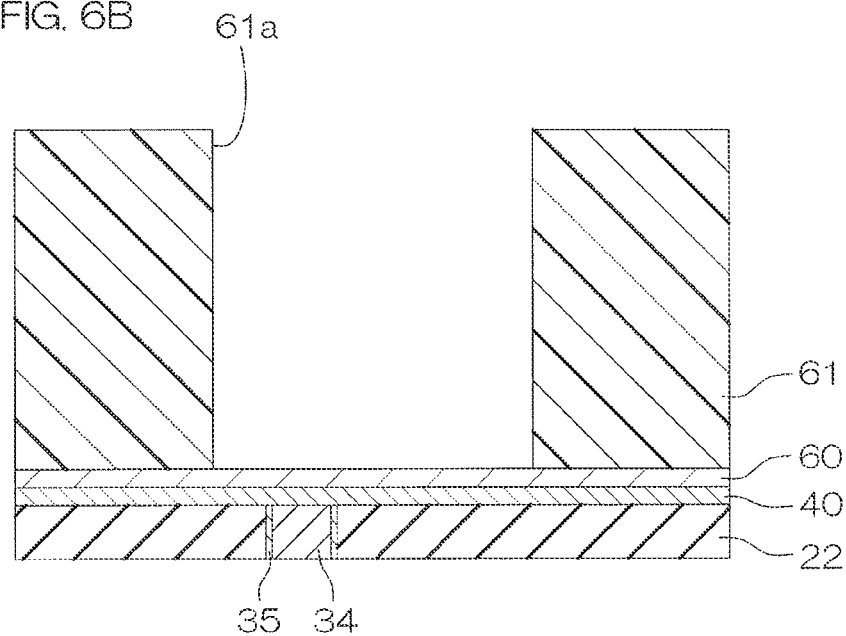

Thereafter, referring to FIG. 6B, a mask 61 having a predetermined pattern is formed on a copper seed layer 60. The mask 61 selectively has an opening 61a that exposes a region in which the Cu electrode layer 41 is to be formed in the copper seed layer 60.

Thereafter, referring to FIG. 6C, the Cu electrode layer 41 is formed. The Cu electrode layer 41 is formed on a surface of the copper seed layer 60 exposed from the opening 61a of the mask 61. The Cu electrode layer 41 may be formed according to an electrolytic copper plating method. The Cu electrode layer 41 is formed so as to extend to a halfway part in a depth direction of the opening 61a of the mask 61. The Cu electrode layer 41 is formed integrally with the copper seed layer 60.

Thereafter, referring to FIG. 6D, the nickel layer 55 and the palladium layer 56 are formed on the upper surface 41a of the Cu electrode layer 41 in this order. The nickel layer 55 and the palladium layer 56 are each formed on the upper surface 41a of the Cu electrode layer 41 exposed from the opening 61a of the mask 61. The nickel layer 55 and the palladium layer 56 may be each formed according to an electroless plating method.

Thereafter, referring to FIG. 6E, the mask 61 is removed.

Thereafter, referring to FIG. 6F, needless parts of the copper seed layer 60 are removed. The copper seed layer 60 may be removed by wet etching. In this step, the side surface 41c of the Cu electrode layer 41 is also partly removed in proportion to the thickness of the copper seed layer 60. Therefore, the side surface 41c of the Cu electrode layer 41 is formed so as to be placed at a more inward position than the side surface of the pad electrode layer 52.

As a result, the pad electrode layer 52 is formed. The pad electrode layer 52 includes a first part 53 mechanically and electrically connected to the upper surface 41a of the Cu electrode layer 41 and a second part 54 that protrudes from the first part 53 toward the lateral side of the barrier electrode layer 40.

Thereafter, referring to FIG. 6G, needless parts of the barrier electrode layer 40 are removed. The barrier electrode layer 40 may be removed by wet etching. In this step, the barrier electrode layer 40 positioned directly under the Cu electrode layer 41 is partly removed in proportion to the thickness of the barrier electrode layer 40. Therefore, the side surface of the barrier electrode layer 40 is formed so as to be placed at a more inward position than the side surface 41c of the Cu electrode layer 41.

Thereafter, referring to FIG. 6H, a corner portion that connects the lower surface 41b and the side surface 41c in the Cu electrode layer 41 is removed. The corner portion of the Cu electrode layer 41 may be removed by wet etching.

The wet etching step is performed until the principal surface of the barrier electrode layer 40 is exposed. As a result, the recess portion 46 that exposes the upper surface of the edge portion of the barrier electrode layer 40 is formed in a region closer to the lower surface 41b of the side surface 41c in the Cu electrode layer 41.

Thereafter, referring to FIG. 6I, the semiconductor substrate 20 is heated, and the bonding wire 5 is joined to the pad electrode layer 52. More specifically, the joining step of the bonding wire 5 is performed after a lead frame (not shown) including the die pad 2 and the lead terminal 3 is prepared and after the semiconductor chip 4 is joined to the die pad 2 of the lead frame.

The semiconductor substrate 20 is heated to, for example, about 200° C. In this step, the Cu electrode layer 41 is also heated in addition to the semiconductor substrate 20, and therefore a natural oxide film that includes copper oxide is formed on the outer surface of the Cu electrode layer 41.

The outer-surface insulating film 50 is formed by this natural oxide film. The recess portion 46 of the Cu electrode layer 41 is formed so as to expose the upper surface of the edge portion of the barrier electrode layer 40, and therefore the outer-surface insulating film 50 is formed so as to come into contact with the upper surface of the edge portion of the barrier electrode layer 40. The outer-surface insulating film 50 is formed so as to come into contact with the principal surface of the barrier electrode layer 40 at a position with an interval from the peripheral edge (side surface) of the barrier electrode layer 40 toward the inward side of the barrier electrode layer 40.

Thereafter, the semiconductor chip 4, along with the lead frame, is sealed by the sealing resin 6. Thereafter, the dicing step of the sealing resin 6 is performed, and the semiconductor device 1 is cut out. Through the process including these steps, the semiconductor device 1 is manufactured.

As described above, in the semiconductor device 1, the outer-surface insulating film 50 that coats the outer surface of the Cu electrode layer 41 is formed so as to come into contact with the principal surface of the barrier electrode layer 40. Particularly, in the semiconductor device 1, the recess portion 46 that exposes the principal surface of the barrier electrode layer 40 is formed on the side surface 41c of the Cu electrode layer 41, and the outer-surface insulating film 50 is formed along the inner surface of the recess portion 46 of the Cu electrode layer 41.

Therefore, it is possible to form the outer-surface insulating film 50 being in contact with the principal surface of the barrier electrode layer 40 at a position with an interval from the peripheral edge (side surface) of the barrier electrode layer 40 toward the inward side of the barrier electrode layer 40.

This makes it possible to restrain a load from the Cu electrode layer 41 or a load from the outer-surface insulating film 50 from being applied directly onto the passivation film 22. As a result, it is possible to restrain a load from being applied from the outer-surface insulating film 50 onto the passivation film 22, and it is possible to restrain a load from being applied from the Cu electrode layer 41 onto the passivation film 22 through the outer-surface insulating film 50.

Therefore, it is possible to restrain stress from being applied to the passivation film 22 placed below the Cu electrode layer 41, and therefore it is possible to provide a semiconductor device 1 having a structure capable of restraining a crack from occurring in the passivation film 22 placed below the Cu electrode layer.

Additionally, in the semiconductor device 1, the barrier electrode layer 40 has a coefficient of thermal expansion lower than that of the Cu electrode layer 41. Therefore, it is possible to make the amount of deformation caused by the thermal expansion of the barrier electrode layer 40 smaller than that of the Cu electrode layer 41.

As a result, it is possible to restrain a load from being transmitted from the barrier electrode layer 40 to the passivation film 22, and it is possible to restrain a load from being transmitted from the Cu electrode layer 41 to the passivation film 22 through the barrier electrode layer 40. Therefore, it is possible to restrain a crack from occurring in the passivation film 22.

Particularly when the barrier electrode layer 40 has a modulus of rigidity higher than that of the Cu electrode layer 41, it is possible to restrain the deformation of the barrier electrode layer 40 from being caused by a load from the Cu electrode layer 41 or by a load from the outer-surface insulating film 50. As a result, it is possible to effectively restrain the load from the Cu electrode layer 41 or the load from the outer-surface insulating film 50 from being transmitted to the passivation film 22 through the barrier electrode layer 40.

FIG. 7 is an enlarged view of a part corresponding to FIG. 4, showing the wiring layer 13 of a semiconductor device 71 and a structure therearound according to a second preferred embodiment of the present invention. Hereinafter, the same reference sign is given to a structure corresponding to the structure described in the first preferred embodiment, and a description of this structure is omitted.

Referring to FIG. 7, the semiconductor device 71 includes the passivation film 22. The barrier electrode layer 40 is formed on the passivation film 22. The Cu electrode layer 41 is formed on the principal surface of the barrier electrode layer 40.

The outer-surface insulating film 50 that coats the outer surface of the Cu electrode layer 41 and that includes copper oxide is formed on the outer surface of the Cu electrode layer 41. The pad electrode layer 52 is formed on the upper surface 41a of the Cu electrode layer 41.

The semiconductor device 71 additionally includes a resin film 72 that coats the outer surface of the Cu electrode layer 41 with the outer-surface insulating film 50 therebetween and that is in contact with the principal surface of the barrier electrode layer 40. The sealing resin 6 is formed so as to coat the resin film 72.

The resin film 72 includes a resin material different from the resin material of the sealing resin 6. The resin film 72 may include at least one kind of phenol resin, polyimide resin, or polyamide resin.

The resin film 72 coats the outer surface of the pad electrode layer 52 in addition to the outer surface of the Cu electrode layer 41. The resin film 72 includes a pad opening 73 that exposes the upper surface of the pad electrode layer 52 to which the bonding wire 5 is connected. The resin film 72 fills the recess portion 46 of the Cu electrode layer 41.

In the present preferred embodiment, the bonding wire 5 is joined to the pad electrode layer 52 after the resin film 72 is formed. Therefore, a part of the outer surface of the Cu electrode layer 41 that is not coated with the resin film 72 does not come into contact with open air, and therefore the outer-surface insulating film 50 including a natural oxide film is restrained from being formed on the outer surface of the Cu electrode layer 41.

The outer-surface insulating film 50 is not necessarily formed along the inner surface of the recess portion 46 of the Cu electrode layer 41 although a form in which the outer-surface insulating film 50 is formed along the inner surface of the recess portion 46 of the Cu electrode layer 41 is shown in FIG. 7.

A part coated with the outer-surface insulating film 50 and a part not coated with the outer-surface insulating film 50 may be included in the inner surface of the recess portion 46 of the Cu electrode layer 41. The thickness T3 of the outer-surface insulating film 50 interposed between the Cu electrode layer 41 and the resin film 72 may be equal to or larger than 0 nm and equal to or smaller than 400 nm. Preferably, the thickness T3 of the outer-surface insulating film 50 is equal to or larger than 0 nm and equal to or smaller than 200 nm.

The outer-surface insulating film 50 may be formed along the inner surface of the recess portion 46 of the Cu electrode layer 41. In this case, the resin film 72 is in contact with the outer-surface insulating film 50 and with the barrier electrode layer 40 in the recess portion 46 of the Cu electrode layer 41.

The outer-surface insulating film 50 may include a part facing the barrier electrode layer 40 with the resin film 72 therebetween and a part being in contact with the principal surface of the barrier electrode layer 40 in the recess portion 46 of the Cu electrode layer 41.

The outer-surface insulating film 50 may be formed only in a region outside the recess portion 46 of the Cu electrode layer 41. In this case, the resin film 72 is in contact with the Cu electrode layer 41 and with the barrier electrode layer 40 in the recess portion 46 of the Cu electrode layer 41.

The outer-surface insulating film 50 may include a part with which the inner surface of the recess portion 46 is coated and a part by which the inner surface of the recess portion 46 is exposed in the inner surface of the recess portion 46 of the Cu electrode layer 41.

In this case, the resin film 72 is in contact with the outer-surface insulating film 50 and with the barrier electrode layer 40 in a part in which the coating part of the outer-surface insulating film 50 is formed in the recess portion 46 of the Cu electrode layer 41. On the other hand, the resin film 72 is in contact with the Cu electrode layer 41 and with the barrier electrode layer 40 in a part in which the exposing part of the outer-surface insulating film 50 is formed in the recess portion 46 of the Cu electrode layer 41.

The sealing resin 6 is formed so as to fill the pad opening 73 formed in the resin film 72 and so as to coat the resin film 72.

FIG. 8A to FIG. 8D are views to describe a process for manufacturing the wiring layer 13 of FIG. 7. A case in which the Cu electrode layer 41 is made of high-purity copper will be hereinafter described as an example.

Figure 8A:
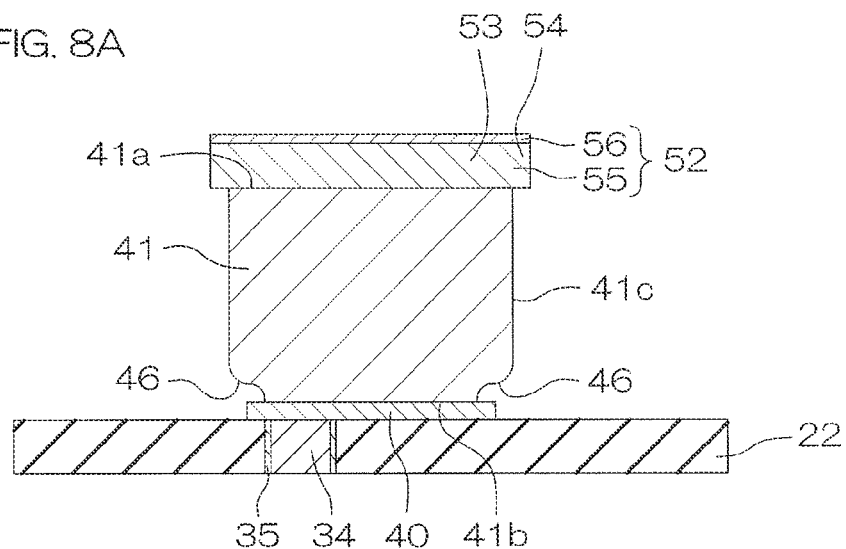
FIG. 8A to FIG. 8D are views to describe a process for manufacturing the wiring layer of FIG. 7.

First, referring to FIG. 8A, a semi-finished product having a structure in which the wiring layer 13 is formed on the passivation film 22 is prepared through the steps of FIG. 6A to FIG. 6G.

Figure 8B:
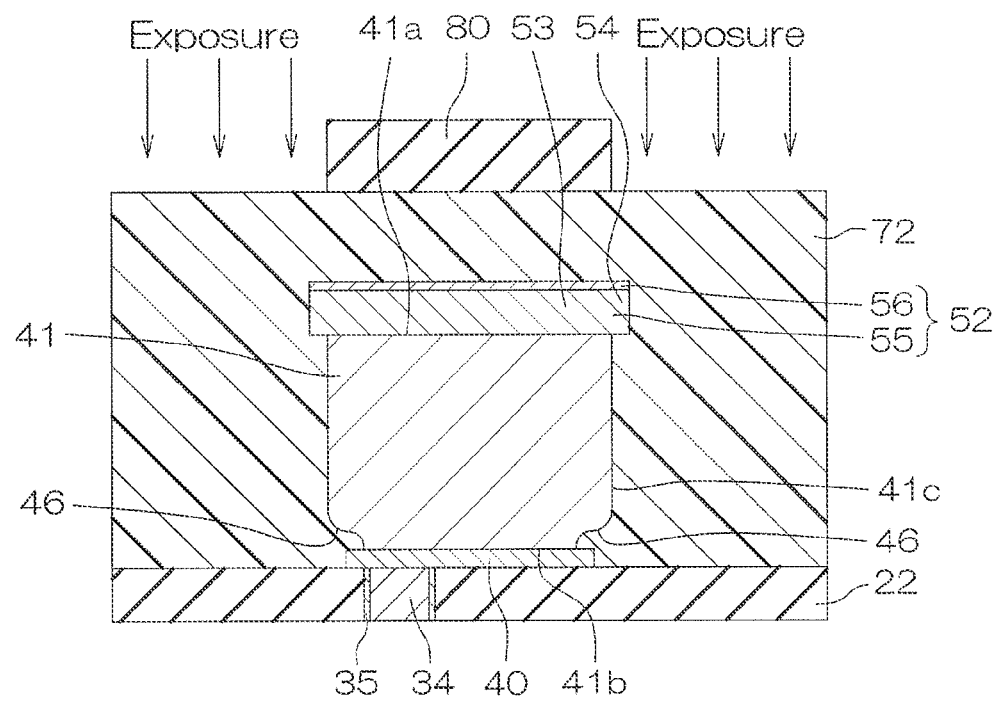

Thereafter, referring to FIG. 8B, the resin film 72 is formed on the passivation film 22 so as to coat the wiring layer 13. The resin film 72 is formed by applying, for example, a photosensitive resin (phenol resin in the present preferred embodiment). Thereafter, the resin film 72 is exposed through a photomask 80 with which a region in which the pad opening 73 is to be formed is coated.

Figure 8C:
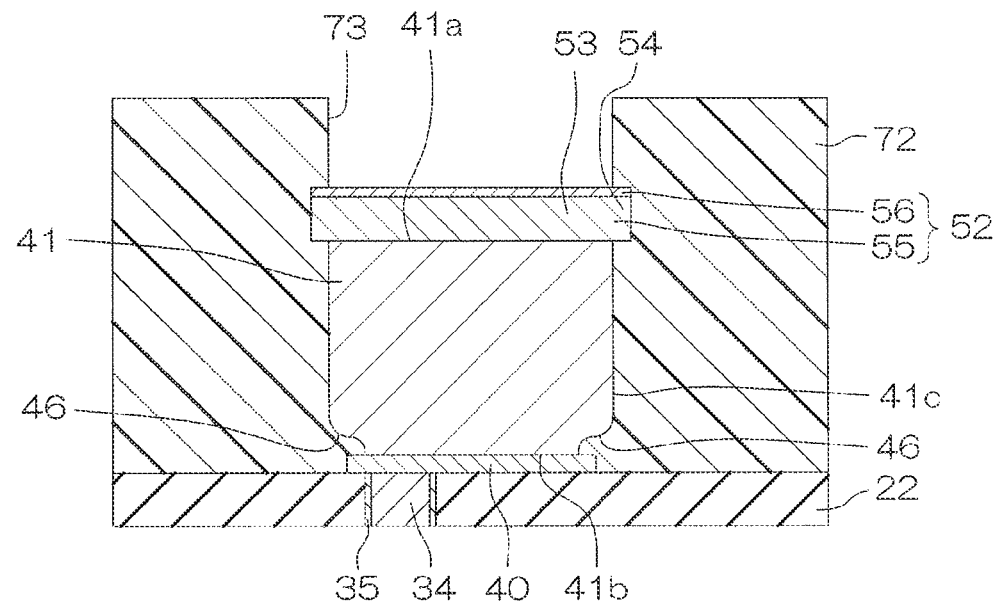

Thereafter, referring to FIG. 8C, the resin film 72 is developed, and the pad opening 73 is formed.

Figure 8D:
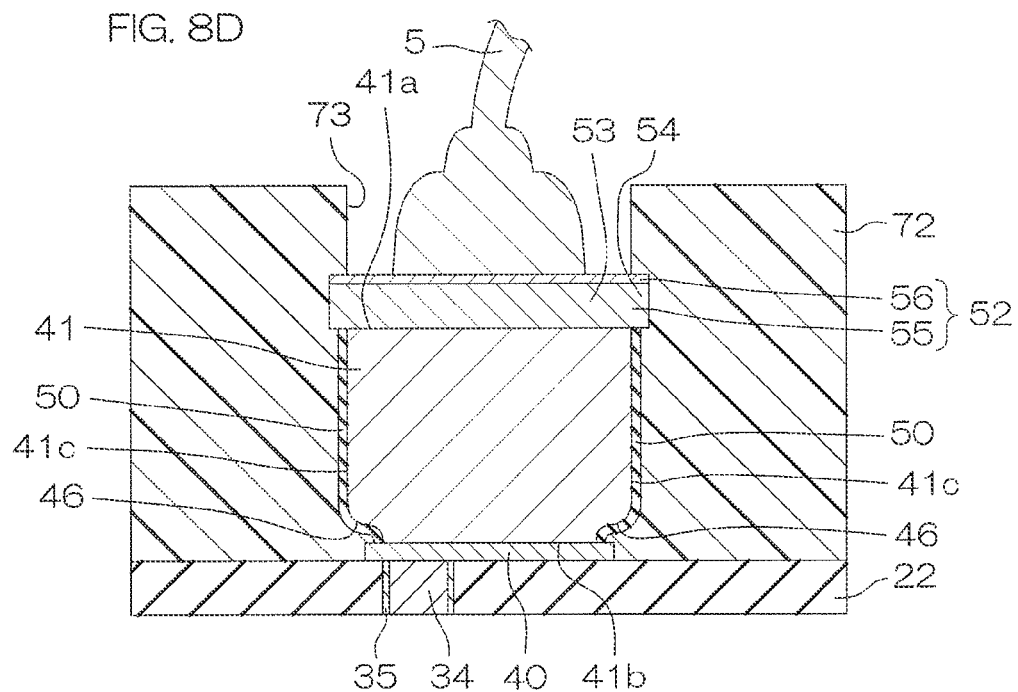

Thereafter, referring to FIG. 8D, the semiconductor substrate 20 is heated, and the bonding wire 5 is joined to the pad electrode layer 52. The joining step of the bonding wire 5 is performed after a lead frame (not shown) including the die pad 2 and the lead terminal 3 is prepared and after the semiconductor chip 4 is joined to the die pad 2 of the lead frame.

The semiconductor substrate 20 is heated to, for example, about 200° C. In this step, the Cu electrode layer 41 is also heated in addition to the semiconductor substrate 20, and therefore a natural oxide film that includes copper oxide is formed on the outer surface of the Cu electrode layer 41.

The outer-surface insulating film 50 is formed by this natural oxide film. Thereafter, the semiconductor chip 4, along with the lead frame, is sealed by the sealing resin 6. Thereafter, the dicing step of the sealing resin 6 is performed, and the semiconductor device 71 is cut out. Through the process including these steps, the semiconductor device 71 is manufactured.

Figure 9:
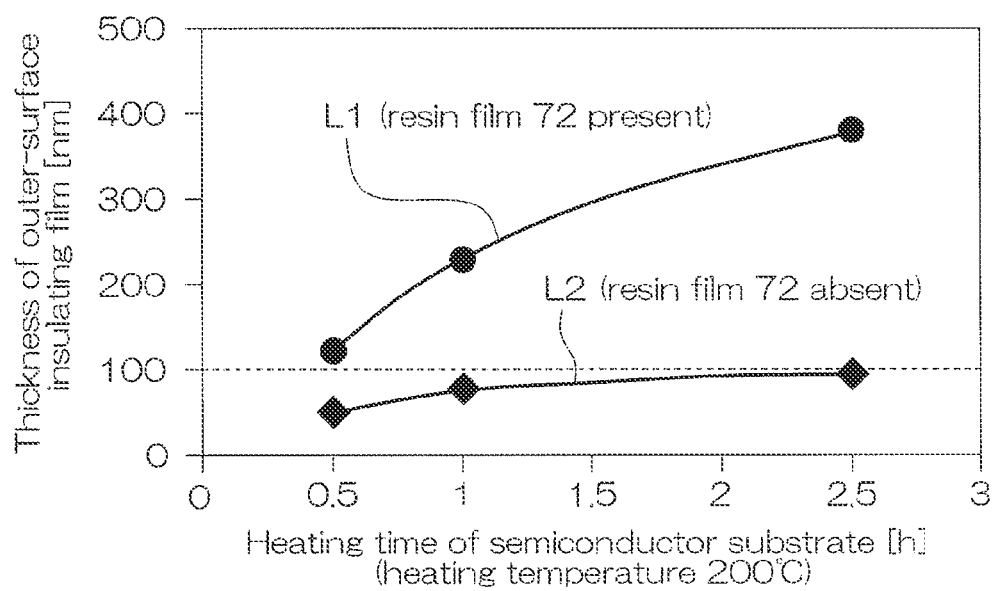
FIG. 9 is a graph showing a result obtained by a simulation concerning a relationship between the thickness of an outer-surface insulating film and a heating time.

FIG. 9 is a graph showing a result obtained by a simulation concerning a relationship between the thickness T3 of the outer-surface insulating film 50 and a heating time. In FIG. 9, the ordinate axis represents the thickness T3 of the outer-surface insulating film 50, and the abscissa axis represents the heating time of the semiconductor substrate 20. The heating temperature of the semiconductor substrate 20 is about 200° C.

A curve L1 and a curve L2 are shown in FIG. 9. The curve L1 shows a relationship when the resin film 72 is not formed. The curve L2 shows a relationship when the resin film 72 is formed.

Referring to the curve L1 and the curve L2, it was understood that the thickness T3 of the outer-surface insulating film 50 becomes smaller in proportion to the shortening of the heating time of the semiconductor substrate 20 whereas the thickness T3 of the outer-surface insulating film 50 becomes larger in proportion to the lengthening of the heating time of the semiconductor substrate 20.

Referring to the curve L1, when the resin film 72 was not formed, the thickness T3 of the outer-surface insulating film 50 exceeded 100 nm in a heating time of 0.5 hours, and exceeded 350 nm in a heating time of 2.5 hours.

On the other hand, referring to the curve L2, when the resin film 72 was formed, the thickness T3 of the outer-surface insulating film 50 was equal to or smaller than 100 nm even in a heating time of 2.5 hours. Therefore, it was understood that the formation of the resin film 72 that coats the outer surface of the Cu electrode layer 41 makes it possible to restrain the outer-surface insulating film 50 (natural oxide film) that is formed on the outer surface of the Cu electrode layer 41 from being thickened.

As described above, in the semiconductor device 71, the resin film 72 that coats the outer surface of the Cu electrode layer 41 through the outer-surface insulating film 50 is formed. This resin film 72 makes it possible to restrain the outer surface of the Cu electrode layer 41 from coming into contact with open air.

Accordingly, it is possible to restrain the outer-surface insulating film 50 (natural oxide film) from being formed on the outer surface of the Cu electrode layer 41, and simultaneously to restrain the outer-surface insulating film 50 (natural oxide film) from growing in the outer surface of the Cu electrode layer 41. As a result, it is possible to restrain the outer-surface insulating film 50 from being thickened, and therefore it is possible to restrain a load from resulting from the thermal expansion of the outer-surface insulating film 50.

Furthermore, the resin film 72 is formed so as to come into contact with the principal surface of the barrier electrode layer 40. Therefore, the outer-surface insulating film 50 formed between the Cu electrode layer 41 and the resin film 72 is formed on the principal surface of the barrier electrode layer 40. Therefore, it is possible to restrain a load from being applied directly onto the passivation film 22 from the Cu electrode layer 41 or from the outer-surface insulating film 50.

Particularly, in the semiconductor device 71, the recess portion 46 is formed at the side surface 41c of the Cu electrode layer 41, and the resin film 72 fills the recess portion 46 of the Cu electrode layer 41. Accordingly, it is possible to restrain the outer-surface insulating film 50 (natural oxide film) from being formed in the recess portion 46 of the Cu electrode layer 41, and simultaneously to restrain the outer-surface insulating film 50 (natural oxide film) from being thickened in the recess portion 46 of the Cu electrode layer 41. Additionally, it is possible to reliably form the outer-surface insulating film 50 at a position with an interval from the peripheral edge (side surface) of the barrier electrode layer 40 toward the inward side of the barrier electrode layer 40.

Therefore, it is possible to restrain a load from being applied onto the passivation film 22 from the outer-surface insulating film 50, and simultaneously to restrain a load from being applied onto the passivation film 22 from the Cu electrode layer 41 through the outer-surface insulating film 50.

Therefore, it is possible to restrain stress from being applied onto the passivation film 22 placed below the Cu electrode layer 41, and therefore it is possible to restrain a crack from occurring in the passivation film 22 placed below the Cu electrode layer 41.

Figure 10:
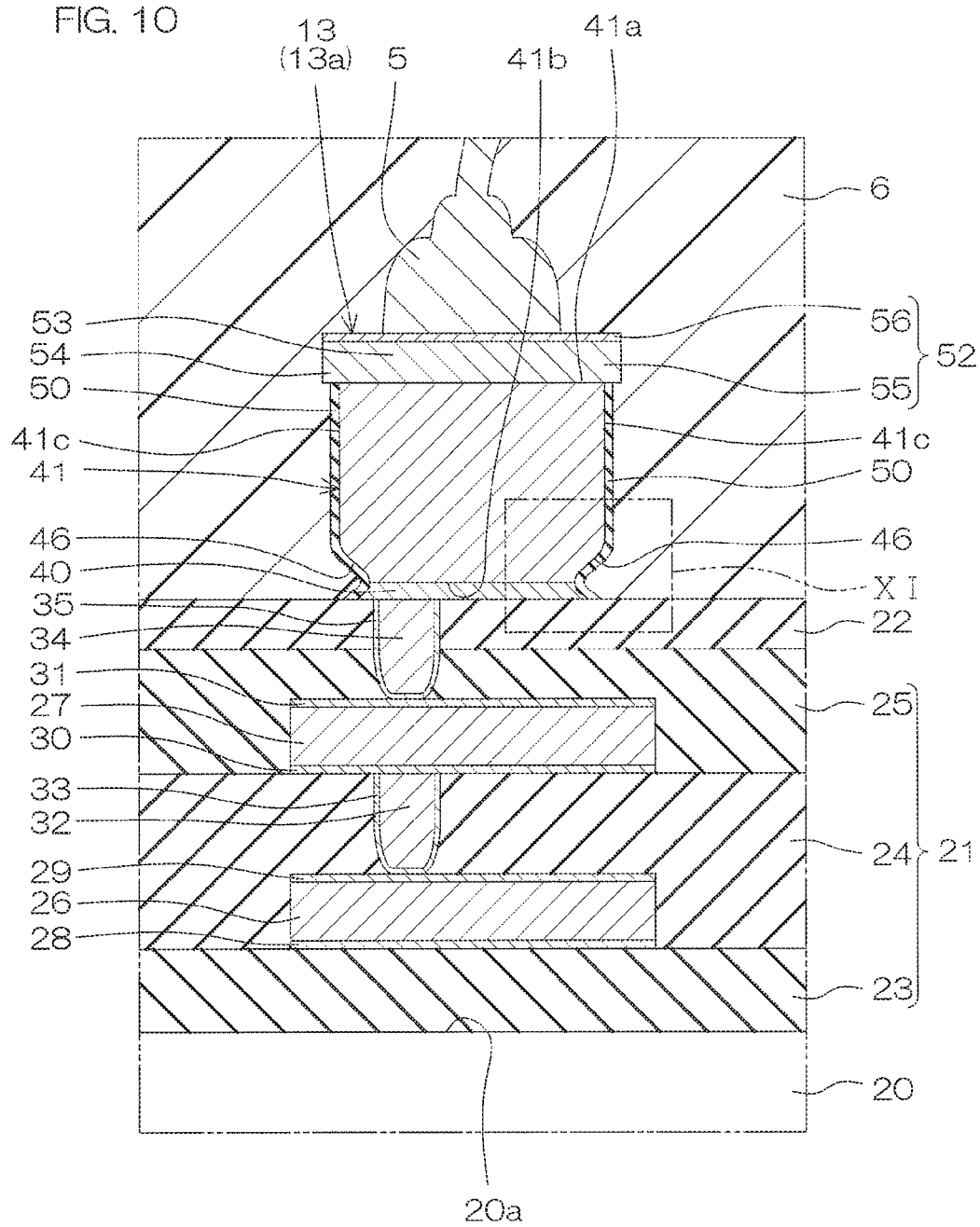
FIG. 10 is an enlarged view of a part corresponding to FIG. 4, showing a wiring layer of a semiconductor device and a structure therearound according to a third preferred embodiment of the present invention.
Figure 11:
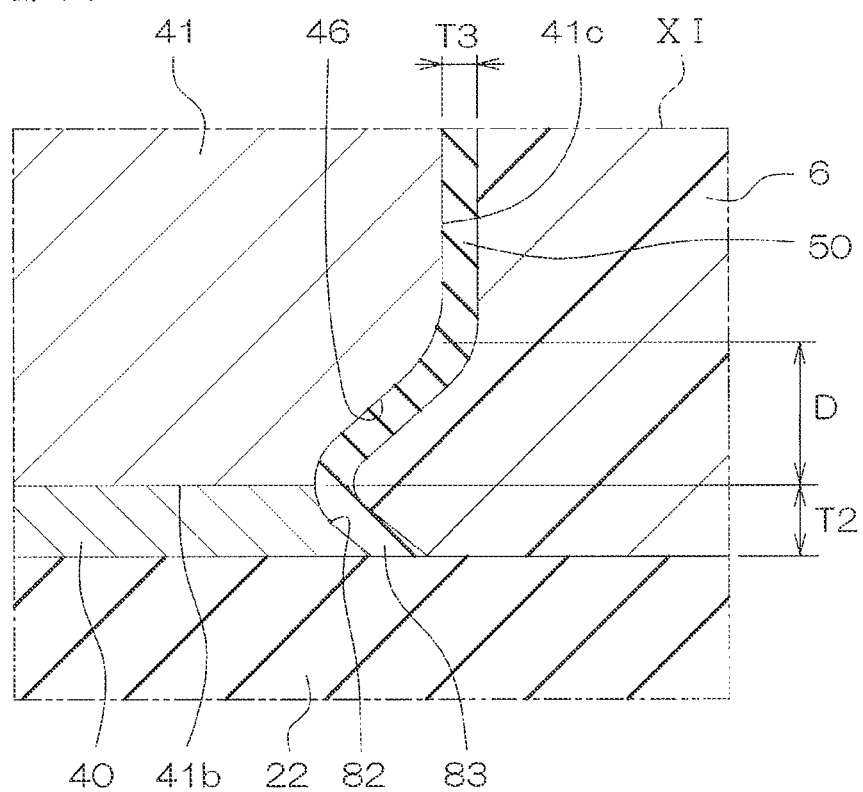
FIG. 11 is an enlarged view of region XI of FIG. 10.

FIG. 10 is an enlarged view of a part corresponding to FIG. 4, showing the wiring layer 13 of a semiconductor device 81 and a structure therearound according to a third preferred embodiment of the present invention. FIG. 11 is an enlarged view of region XI of FIG. 10. Hereinafter, the same reference sign is given to a structure corresponding to the structure described in the first preferred embodiment, and a description of this structure is omitted.

In the first preferred embodiment, a description has been given of the step (see FIG. 6H) in which the corner portion that connects the lower surface 41b and the side surface 41c of the Cu electrode layer 41 is removed by wet etching and in which the Cu electrode layer 41 having the recess portion 46 by which the principal surface of the barrier electrode layer 40 is exposed is formed.

On the other hand, referring to FIG. 10 and FIG. 11, in the semiconductor device 81, the edge portion of the barrier electrode layer 40 is also simultaneously removed in addition to the corner portion that connects the lower surface 41b and the side surface 41c of the Cu electrode layer 41.

In the principal surface of the barrier electrode layer 40, an edge portion exposed from the recess portion 46 of the Cu electrode layer 41 includes an oblique surface 82 descending and slanting toward the lateral side of the barrier electrode layer 40. The oblique surface 82 of the barrier electrode layer 40 is formed so as to be continuous with the inner surface of the recess portion 46. The oblique surface 82 of the barrier electrode layer 40 faces the inner surface of the recess portion 46 in a direction in which the Cu electrode layer 41 is laminated on the barrier electrode layer 40.

The outer-surface insulating film 50 with which the outer surface of the Cu electrode layer 41 is coated has an extension portion 83 that extends along the oblique surface 82 of the barrier electrode layer 40 and with which the oblique surface 82 of the barrier electrode layer 40 is coated. The extension portion 83 of the outer-surface insulating film 50 may be in contact with the passivation film 22.

The outer-surface insulating film 50 with which the inner surface of the recess portion 46 is coated and the outer-surface insulating film 50 (extension portion 83) with which the oblique surface 82 of the barrier electrode layer 40 is coated extend in directions that intersect each other, respectively. The extension portion 83 of the outer-surface insulating film 50 is formed in a tapered shape in which its thickness T3 gradually becomes smaller toward its forward end positioned on the passivation film 22.

As described above, in the semiconductor device 81, the extension portion 83 of the outer-surface insulating film 50 is in contact with the oblique surface 82 (principal surface) of the barrier electrode layer 40. Therefore, it is possible to restrain a load from being applied directly onto the passivation film 22 from the Cu electrode layer 41 or from the outer-surface insulating film 50.

Accordingly, it is possible to restrain a load from being applied from the outer-surface insulating film 50 to the passivation film 22, and it is possible to restrain a load from being applied from the Cu electrode layer 41 to the passivation film 22 through the outer-surface insulating film 50.

In the semiconductor device 81, in the outer-surface insulating film 50, a part with which the inner surface of the recess portion 46 is coated and a part (extension portion 83) with which the oblique surface 82 of the barrier electrode layer 40 is coated extend in directions that intersect each other, respectively.

Therefore, even if the thermal expansion of the Cu electrode layer 41 or the thermal expansion of the outer-surface insulating film 50 occurs, it is difficult for a load from the Cu electrode layer 41 or a load from the outer-surface insulating film 50 to be transmitted along the surface of the passivation film 22 although the extension portion 83 of the outer-surface insulating film 50 is in contact with the passivation film 22.

Furthermore, in the semiconductor device 81, the extension portion 83 of the outer-surface insulating film 50 is formed in a tapered shape in which its thickness T3 gradually becomes smaller toward its forward end positioned on the passivation film 22, and therefore it is possible to reduce stress in a direction along the surface of the passivation film 22 by reducing stress resulting from the thermal expansion in an edge portion of the extension portion 83 of the outer-surface insulating film 50.

Therefore, it is possible to fulfill the same effect as the effect described in the first preferred embodiment. Of course, the resin film 72 according to the second preferred embodiment may be applied to the semiconductor device 81.

Figure 12:
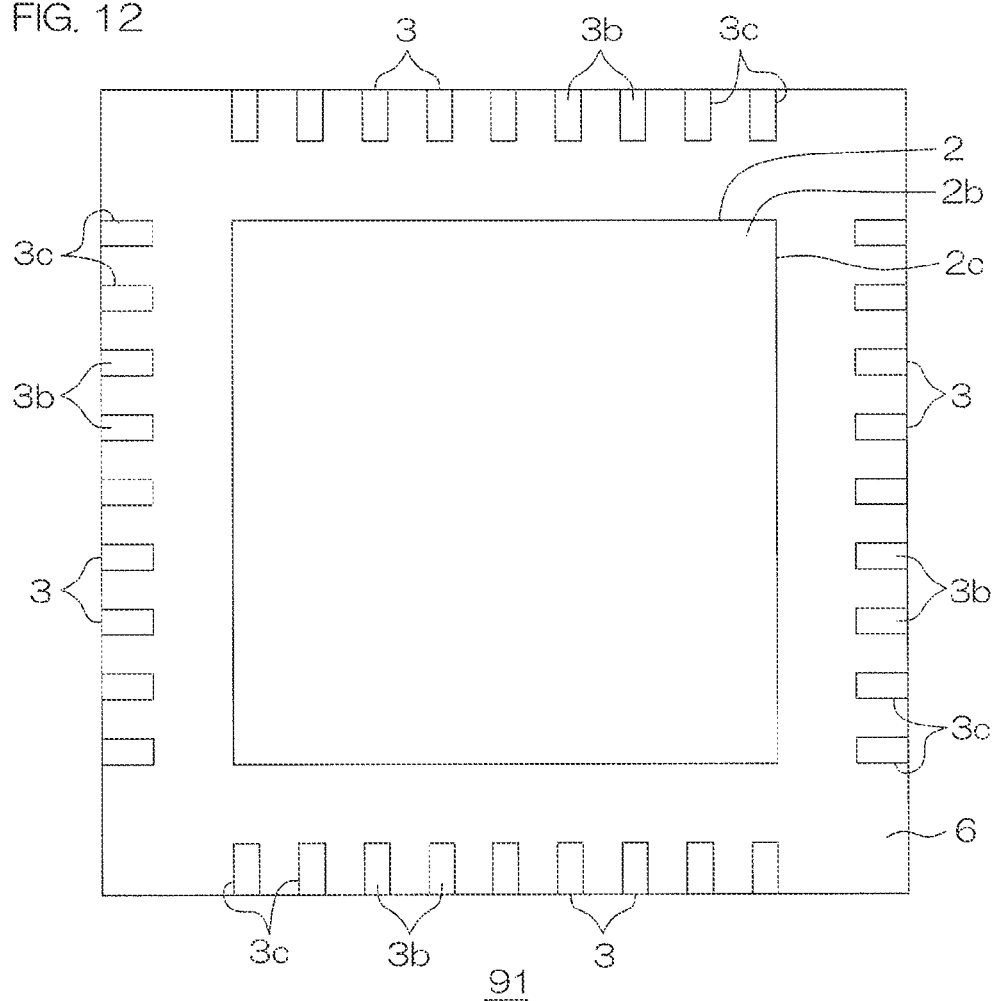
FIG. 12 is a bottom view showing a semiconductor device according to a fourth preferred embodiment of the present invention.
Figure 13:
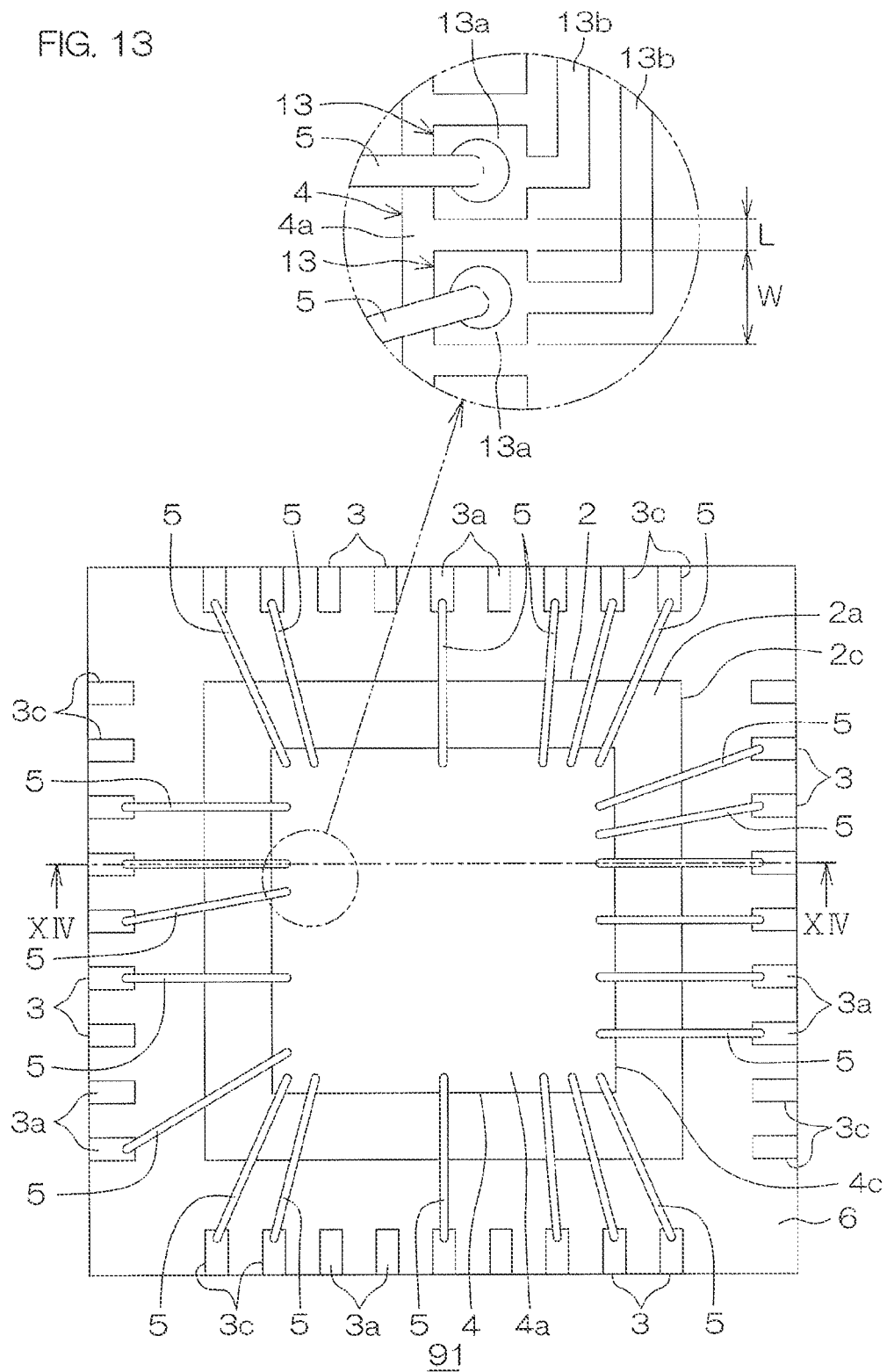
FIG. 13 is a plan view showing an internal structure of the semiconductor device of FIG. 12.
Figure 14:
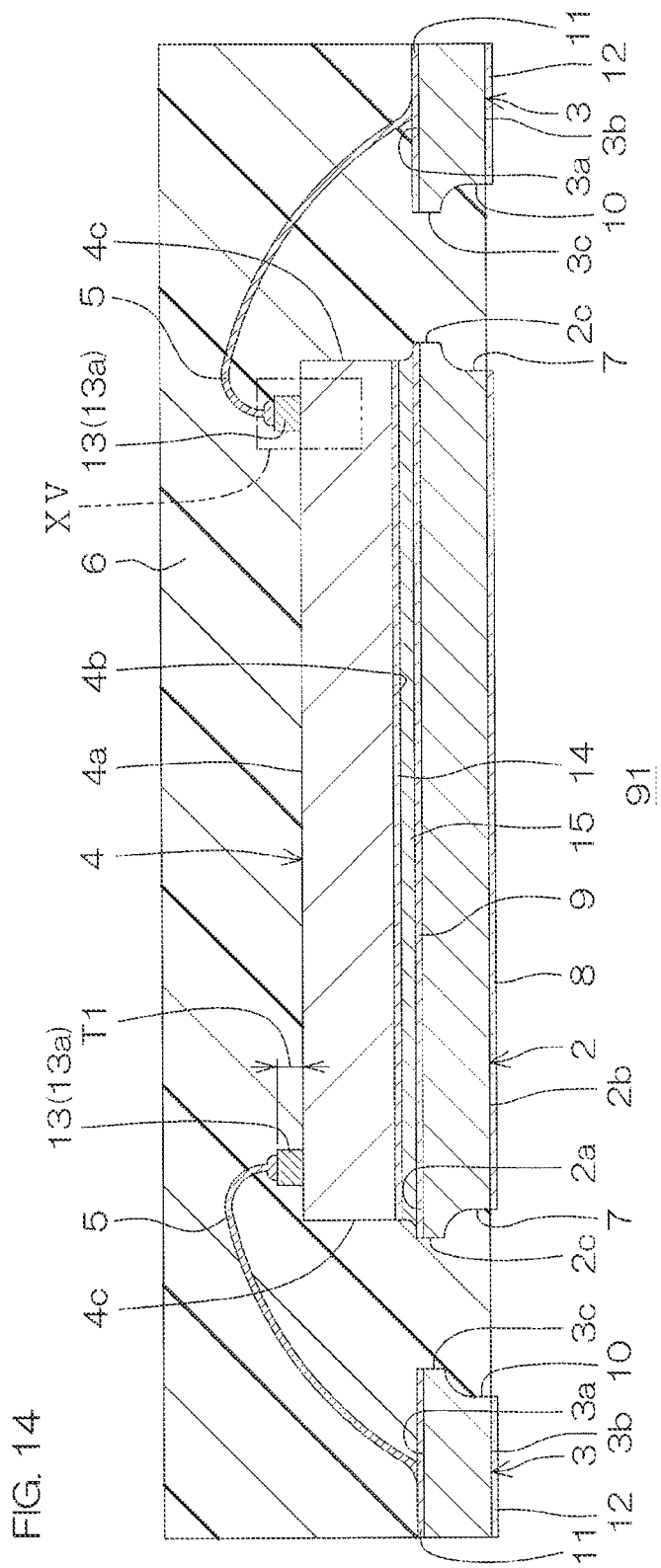
FIG. 14 is a cross-sectional view along line XIV-XIV of FIG. 13.

FIG. 12 is a bottom view showing a semiconductor device 91 according to a forth preferred embodiment of the present invention. FIG. 13 is a plan view showing an internal structure of the semiconductor device 91 of FIG. 12. FIG. 14 is a cross-sectional view along line XIV-XIV of FIG. 13. A structure corresponding to each structure described with respect to the semiconductor devices 1, 71, and 81 will be hereinafter described by giving the same reference sign thereto.

The semiconductor device 91 is a semiconductor device to which QFN (Quad Flat Non-leaded Package) is applied as a form of a semiconductor package.

Referring to FIG. 12 to FIG. 14, the semiconductor device 91 includes a die pad 2, lead terminals 3, a semiconductor chip 4, bonding wires 5 (wires), and a sealing resin 6 that seals up those elements. The sealing resin 6 may include an epoxy resin. The sealing resin 6 is formed in a flat rectangular parallelepiped shape.

The die pad 2 includes a first principal surface 2a, a second principal surface 2b on the side opposite to the first principal surface 2a, and a side surface 2c that connects the first principal surface 2a and the second principal surface 2b. The die pad 2 is formed in a quadrilateral shape in a plan view as viewed from a normal direction of the first principal surface 2a (hereinafter, referred to simply as "in the plan view"). A recess portion 7 that is hollowed from a second-principal-surface-2b side toward a first-principal-surface-2a side is formed at a peripheral edge portion on the second-principal-surface-2b side of the die pad 2 over its entire periphery.

The sealing resin 6 is formed so as to enter the recess portion 7 of the die pad 2. This restrains the die pad 2 from falling off the sealing resin 6. The second principal surface 2b of the die pad 2 is exposed from the sealing resin 6 except for a part in which the recess portion 7 is formed. A silver plating film 8 is formed on the first principal surface 2a of the die pad 2. On the other hand, a solder plating film 9 is formed on the second principal surface 2b of the die pad 2 exposed from the sealing resin 6.

A plurality of lead terminals each of which is the lead terminal 3 are arranged around the die pad 2. More specifically, the lead terminal 3 is provided such that a plurality of lead terminals (nine lead terminals in the present preferred embodiment) are arranged at each position that faces each of the side surfaces 2c of the die pad 2 in the present preferred embodiment.

The lead terminals 3 that face the single side surface 2c of the die pad 2 are evenly spaced out along the single side surface 2c, and are each formed in a rectangular parallelepiped shape that extends in a direction perpendicular to the single side surface 2c.

The lead terminal 3 includes a first principal surface 3a, a second principal surface 3b on the side opposite to the first principal surface 3a, and a side surface 3c that connects the first principal surface 3a and the second principal surface 3b. A recess portion 10 that is hollowed from a second-principal-surface-3b side toward a first-principal-surface-3a side is formed at the second principal surface 3b of the lead terminal 3.

The recess portion 10 of the lead terminal 3 is formed at an end part of the die-pad-2 side in the lead terminal 3. The sealing resin 6 is formed so as to enter the recess portion 10 of the lead terminal 3. This restrains the lead terminal 3 from falling off the sealing resin 6.

The second principal surface 3b of the lead terminal 3 is exposed from the sealing resin 6 except for a part in which the recess portion 10 is formed. A silver plating film 11 is formed on the first principal surface 3a of the lead terminal 3. A solder plating film 12 is formed on the second principal surface 3b of the lead terminal 3 exposed from the sealing resin 6.

The semiconductor chip 4 is formed in a quadrilateral shape in the plan view, and includes a first principal surface 4a, a second principal surface 4b positioned on the side opposite to the first principal surface 4a, and a side surface 4c that connects the first principal surface 4a and the second principal surface 4b. A plurality of wiring layers 13 are formed on the first principal surface 4a of the semiconductor chip 4. A metal film 14 with which the second principal surface 4b is coated is formed on the second principal surface 4b of the semiconductor chip 4.

The wiring layers 13 are formed on the first principal surface 4a of the semiconductor chip 4 as to be separated from each other with intervals therebetween. Each wiring layer 13 integrally includes a pad portion 13a connected mechanically and electrically to the bonding wire 5 and a drawn portion 13b drawn out from the pad portion 13a to other regions provided on a passivation film 22. The pad portion 13a of each wiring layer 13 is formed in a quadrilateral shape in the plan view in the present preferred embodiment.

Referring to FIG. 13 and FIG. 14, the width W of the pad portion 13a may be equal to or larger than 5 μm and equal to or smaller than 300 μm. The thickness T1 of the pad portion 13a may be equal to or larger than 3 μm and equal to or smaller than 25 μm. The aspect ratio R of the pad portion 13a (=thickness T1/width W) may be $0 < R \leq 1$. The distance L between the pad portions 13a that adjoin each other may be equal to or smaller than 20 μm.

The metal film 14 formed on the second principal surface 4b of the semiconductor chip 4 is joined to the first principal surface 2a (the silver plating film 8) of the die pad 2 through a metallic junction material 15. The junction material 15 may be a solder or may be a metallic paste material.

The semiconductor chip 4 is supported by the die pad 2 in a posture in which the first principal surface 4a is directed upward. In a case in which the semiconductor chip 4 and the die pad 2 are not required to be electrically connected, the semiconductor chip 4 and the die pad 2 may be joined by use of a junction material made of an insulating material instead of the metallic junction material 15. In this case, the silver plating film 8 may be excluded from the first principal surface 2a of the die pad 2.

The wiring layer 13 formed on the first principal surface 4a of the semiconductor chip 4 is electrically connected to the lead terminal 3 corresponding thereto through the bonding wire 5. The bonding wire 5 may include aluminum, copper, or gold.

Figure 15:
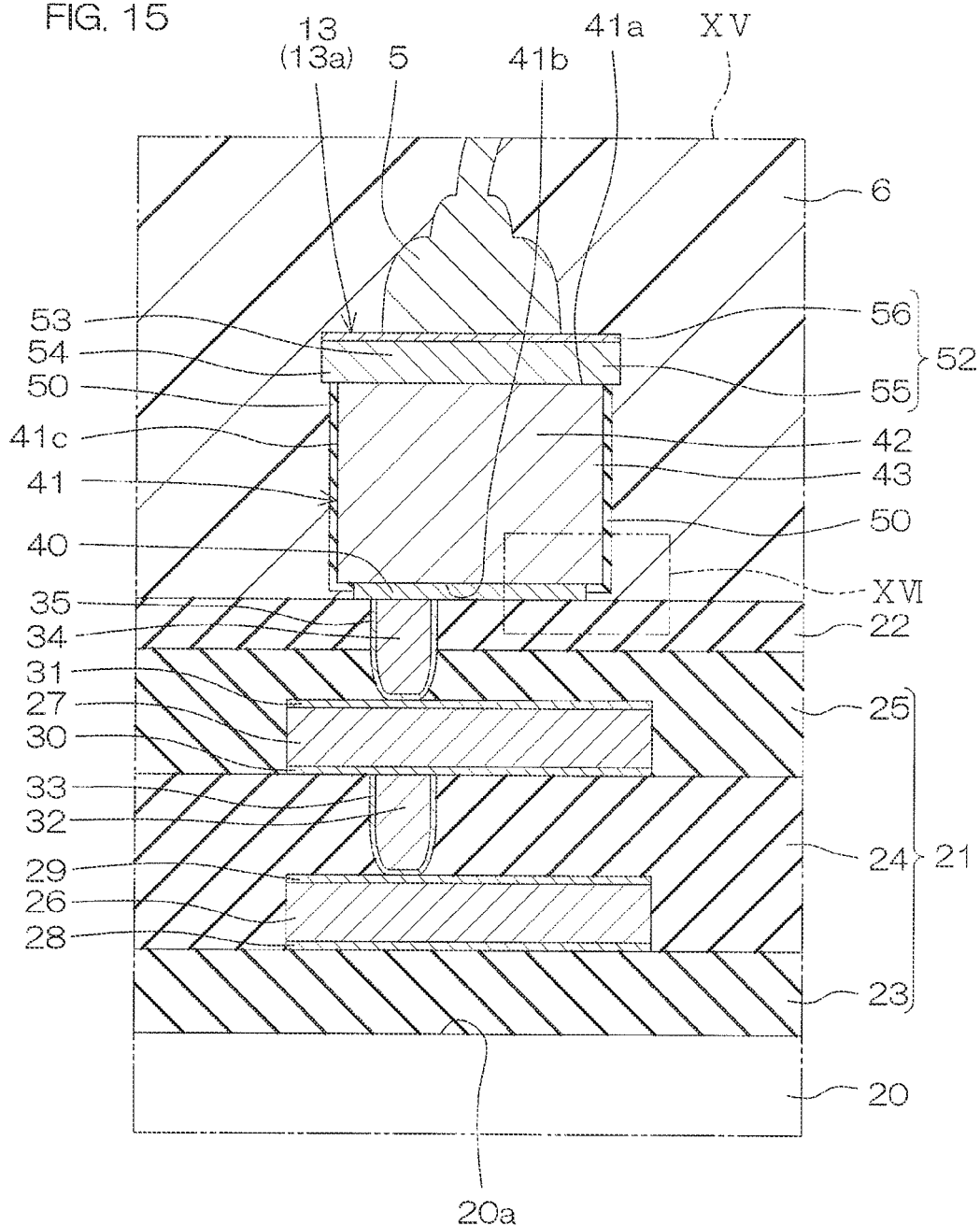
FIG. 15 is an enlarged view of region XV of FIG. 14.
Figure 16:
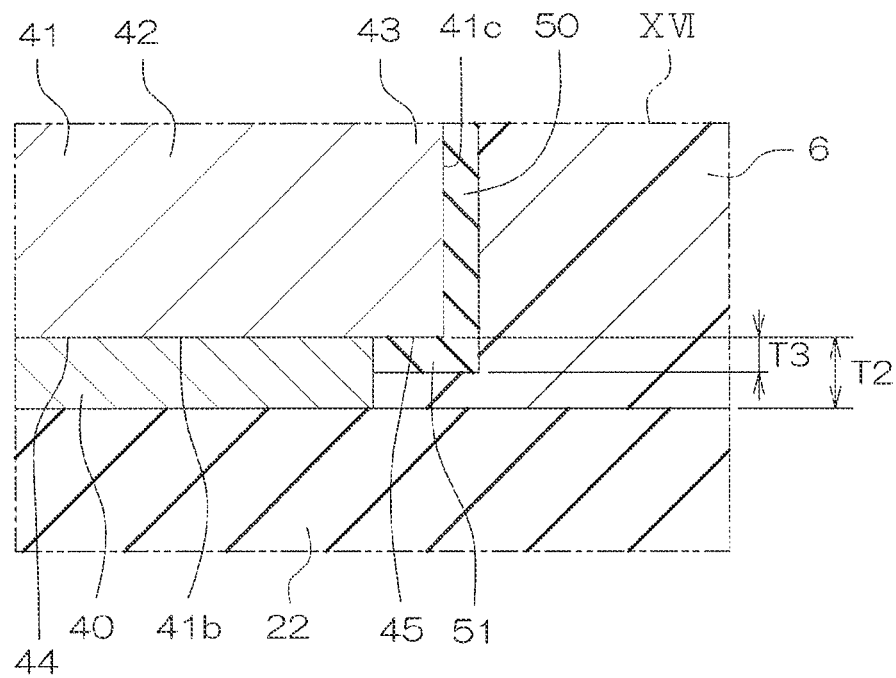
FIG. 16 is an enlarged view of region XVI of FIG. 15.

FIG. 15 is an enlarged view of region XV of FIG. 14. FIG. 16 is an enlarged view of region XVI of FIG. 15.

Referring to FIG. 15, the semiconductor chip 4 includes a semiconductor substrate 20, a multilayer wiring structure 21, a passivation film 22 (insulating layer), and the plurality of wiring layers 13. In FIG. 15, only the pad portion 13a of the single wiring layer 13 among the wiring layers 13 is shown.

The semiconductor substrate 20 may be a silicon substrate. The semiconductor substrate 20 has a device-forming surface 20a on which a functional device is formed. A diode, a transistor, a resistor, a capacitor, etc., can be mentioned as examples of the functional device formed on the device-forming surface 20a.

The multilayer wiring structure 21 includes a plurality of interlayer insulating films 23, 24, and 25 formed on the device-forming surface 20a of the semiconductor substrate 20 and a plurality of electrode layers 26 and 27 formed inside the interlayer insulating films 23, 24, and 25.

The interlayer insulating films 23, 24, and 25 include a first interlayer insulating film 23 formed on the device-forming surface 20a of the semiconductor substrate 20, a second interlayer insulating film 24 formed on the first interlayer insulating film 23, and a third interlayer insulating film 25 formed on the second interlayer insulating film 24. The first interlayer insulating film 23, the second interlayer insulating film 24, and the third interlayer insulating film 25 may each include an oxide film ($SiO_2$ film) or a nitride film (SiN film).

The electrode layers 26 and 27 include a first electrode layer 26 that is formed on the first interlayer insulating film 23 and that is coated with the second interlayer insulating film 24 and a second electrode layer 27 that is formed on the second interlayer insulating film 24 and that is coated with the third interlayer insulating film 25. The first electrode layer 26 and the second electrode layer 27 may each include copper or aluminum.

A first lower surface barrier electrode layer 28 is formed on a lower surface of the first electrode layer 26. The first lower surface barrier electrode layer 28 restrains an electrode material of which the first electrode layer 26 is made from diffusing into the first interlayer insulating film 23.

A first upper surface barrier electrode layer 29 is formed on an upper surface of the first electrode layer 26. The first upper surface barrier electrode layer 29 restrains an electrode material of which the first electrode layer 26 is made from diffusing into the second interlayer insulating film 24.

A second lower surface barrier electrode layer 30 is formed on a lower surface of the second electrode layer 27. The second lower surface barrier electrode layer 30 restrains an electrode material of which the second electrode layer 27 is made from diffusing into the second interlayer insulating film 24.

A second upper surface barrier electrode layer 31 is formed on an upper surface of the second electrode layer 27. The second upper surface barrier electrode layer 31 restrains an electrode material of which the second electrode layer 27 is made from diffusing into the third interlayer insulating film 25.

The first lower surface barrier electrode layer 28 and the second lower surface barrier electrode layer 30 may have a single-layer structure consisting of a titanium nitride layer or of a titanium layer, or may have a laminated structure including a titanium nitride layer and a titanium layer formed on the titanium nitride layer.

The first upper surface barrier electrode layer 29 and the second upper surface barrier electrode layer 31 may have a single-layer structure consisting of a titanium nitride layer or of a titanium layer, or may have a laminated structure including a titanium nitride layer and a titanium layer formed on the titanium nitride layer.

The passivation film 22 is formed on the multilayer wiring structure 21 so as to coat the multilayer wiring structure 21. More specifically, the passivation film 22 is formed on the third interlayer insulating film 25 so as to coat the third interlayer insulating film 25.

The passivation film 22 may include an oxide film ($SiO_2$ film), a BPSG (Boron Phosphorus Silicon Glass) film, or a nitride film (SiN film). The passivation film 22 may have a laminated structure including a nitride film (SiN film) and an oxide film ($SiO_2$ film) that are laminated from the surface of the third interlayer insulating film 25 in this order. The passivation film 22 is a nitride film (SiN film) in the present preferred embodiment.

A first via electrode 32 that passes through the second interlayer insulating film 24 is formed in the second interlayer insulating film 24 between the upper surface of the first electrode layer 26 and the lower surface of the second electrode layer 27. The first electrode layer 26 is electrically connected to the second electrode layer 27 through the first via electrode 32.

A first barrier electrode film 33 is formed between the first via electrode 32 and the second interlayer insulating film 24. The first via electrode 32 may include tungsten. The first barrier electrode film 33 may include titanium nitride.

A second via electrode 34 that passes through the passivation film 22 and through the third interlayer insulating film 25 is formed in the passivation film 22 and the third interlayer insulating film 25 that are above the upper surface of the second electrode layer 27. The second via electrode 34 is exposed from the passivation film 22, and is electrically connected to the second electrode layer 27.

An exposed surface of the second via electrode 34 is formed so as to be flush with the surface of the passivation film 22. A second barrier electrode film 35 is formed between the second via electrode 34 and the third interlayer insulating film 25 and between the second via electrode 34 and the passivation film 22. The second via electrode 34 may include tungsten. The second barrier electrode film 35 may include titanium nitride.

The wiring layer 13 is formed on the passivation film 22 so as to coat the second via electrode 34. The wiring layer 13 has a laminated structure including a barrier electrode layer 40 formed on the passivation film 22 and a Cu electrode layer 41 that includes a metal composed mainly of copper and that is formed on a principal surface of the barrier electrode layer 40. The barrier electrode layer 40 restrains an electrode material of which the Cu electrode layer 41 is made from diffusing into the passivation film 22.

The term "metal composed mainly of copper" denotes a metal in which the mass ratio (mass %) of copper that is a component of the Cu electrode layer 41 is the highest with respect to other components of the Cu electrode layer 41 (the same applies hereinafter). In a case in which the Cu electrode layer 41 is made of an aluminum copper alloy (Al—Cu alloy), the mass ratio $R_{Cu}$ of copper is higher than the mass ratio RA1 of aluminum ($R_{Cu}>R_{Al}$).

In a case in which the Cu electrode layer 41 is made of an aluminum-silicon-copper alloy (Al—Si—Cu alloy), the mass ratio $R_{Cu}$ of copper is higher than the mass ratio $R_{Al}$ of aluminum, and is higher than the mass ratio $R_{Si}$ of silicon ($R_{Cu}>R_{Al}$ and $R_{Cu}>R_{Si}$).

Although there is a case in which the "metal composed mainly of copper" includes a slight amount of impurities, it includes high-purity copper, such as high-purity copper whose purity is equal to or more than 99.9999% (6N) or high-purity copper whose purity is equal to or more than 99.99% (4N).

The barrier electrode layer 40 is formed on the passivation film 22 so as to coat the second via electrode 34. The barrier electrode layer 40 is electrically connected to the first electrode layer 26 and the second electrode layer 27 through the second via electrode 34.

The barrier electrode layer 40 may have a thickness of equal to or larger than 100 nm and equal to or smaller than 500 nm (e.g. about 100 nm). The barrier electrode layer 40 may have a single-layer structure consisting of a single metallic layer. The barrier electrode layer 40 may have a laminated structure in which a plurality of metallic layers are laminated.

Preferably, the barrier electrode layer 40 has a coefficient of thermal expansion smaller than that of the Cu electrode layer 41. Additionally, preferably, the barrier electrode layer 40 has a modulus of rigidity larger than that of the Cu electrode layer 41.

The barrier electrode layer 40 may include at least one kind of titanium, titanium nitride, tantalum, tungsten, molybdenum, chrome, or ruthenium. With these metallic materials, it is possible to realize the barrier electrode layer 40 that has a coefficient of thermal expansion (equal to or larger than 4 μm/m·K and equal to or smaller than 9 μm/m·K) smaller than that of the Cu electrode layer 41. In a case in which the Cu electrode layer 41 is made of high-purity copper, the coefficient of thermal expansion of the Cu electrode layer 41 is about 16.5 μm/m·K.

The barrier electrode layer 40 may include at least one kind of tantalum, tungsten, molybdenum, chrome, or ruthenium. With these metallic materials, it is possible to realize the barrier electrode layer 40 that has a coefficient of thermal expansion (equal to or larger than 4 μm/m·K and equal to or smaller than 7 μm/m·K) smaller than that of the Cu electrode layer 41.

Additionally, with these metallic materials, it is possible to realize the barrier electrode layer 40 that has a modulus of rigidity (equal to or larger than 50 Gpa and equal to or smaller than 180 Gpa) larger than that of the Cu electrode layer 41. In a case in which the Cu electrode layer 41 is made of high-purity copper, the modulus of rigidity of the Cu electrode layer 41 is about 48 Gpa.

Referring to FIG. 15 and FIG. 16, the Cu electrode layer 41 occupies most of the wiring layer 13. The Cu electrode layer 41 may have a thickness of equal to or larger than 3 μm and equal to or smaller than 20 μm. The Cu electrode layer 41 has an upper surface 41a (first surface), a lower surface 41b (second surface) positioned on the side opposite to the upper surface 41a, and a side surface 41c that connects the upper surface 41a and the lower surface 41b. The lower surface 41b of the Cu electrode layer 41 is mechanically and electrically connected to the barrier electrode layer 40.

More specifically, the Cu electrode layer 41 includes a first part 42 positioned on the barrier electrode layer 40 and a second part 43 that protrudes from the first part 42 toward the lateral side of the barrier electrode layer 40. The first part 42 of the Cu electrode layer 41 has a connection portion 44 mechanically and electrically connected to the barrier electrode layer 40.

The second part 43 of the Cu electrode layer 41 has a facing portion 45 that faces the passivation film 22 in a direction in which the Cu electrode layer 41 is laminated on the barrier electrode layer 40. The facing portion 45 of the second part 43 is formed with an interval from the passivation film 22 in the direction in which the Cu electrode layer 41 is laminated on the barrier electrode layer 40. The facing portion 45 of the second part 43 is formed so as to be flush with the connection portion 44 of the first part 42.

The upper surface 41a and the lower surface 41b of the Cu electrode layer 41 are defined by the connection portion 44 of the first part 42 and the facing portion 45 of the second part 43. Additionally, the side surface 41c of the Cu electrode layer 41 is defined by the facing portion 45 of the second part 43.

Referring to FIG. 15 and FIG. 16, the outer-surface insulating film 50 is formed on the outer surface of the Cu electrode layer 41 so as to coat the outer surface of the Cu electrode layer 41. The outer-surface insulating film 50 includes a natural oxide film formed by naturally oxidizing the copper constituting the Cu electrode layer 41.

Therefore, the outer-surface insulating film 50 includes copper oxide ($Cu_2O$ and/or $CuO$). The outer-surface insulating film 50 coats the side surface 41c of the Cu electrode layer 41, and is formed with an interval from the passivation film 22 in a direction in which the Cu electrode layer 41 is laminated on the barrier electrode layer 40.

More specifically, the outer-surface insulating film 50 includes a coating portion 51 that extends continuously from the side surface 41c of the Cu electrode layer 41 along the lower surface 41b of the Cu electrode layer 41 and with which the facing portion 45 of the Cu electrode layer 41 is coated.

In the outer-surface insulating film 50, its one surface and its other surface (surface on the Cu-electrode-layer-41 side) on the side opposite to the one surface are formed along the lower surface 41b of the Cu electrode layer 41 from the side surface 41c of the Cu electrode layer 41.

In the present preferred embodiment, the outer-surface insulating film 50 coats the whole area of the side surface 41c of the Cu electrode layer 41 and the whole area of the facing portion 45 of the Cu electrode layer 41. The coating portion 51 of the outer-surface insulating film 50 is formed with an interval from the passivation film 22 in a direction in which the Cu electrode layer 41 is laminated on the barrier electrode layer 40. The coating portion 51 of the outer-surface insulating film 50 is in contact with the side surface of the barrier electrode layer 40.

Referring to FIG. 16, at least the coating portion 51 of the outer-surface insulating film 50 in the outer-surface insulating film 50 has a thickness T3 smaller than the thickness T2 of the barrier electrode layer 40. Substantially the whole area of the outer-surface insulating film 50 may be formed with the thickness T3 smaller than the thickness T2 of the barrier electrode layer 40.

In the present preferred embodiment, the sealing resin 6 fills a space between the passivation film 22 and the coating portion 51 of the outer-surface insulating film 50, and the coating portion 51 of the outer-surface insulating film 50 faces the passivation film 22 through the sealing resin 6.

The wiring layer 13 includes a pad electrode layer 52 formed on the upper surface 41a of the Cu electrode layer 41. The pad electrode layer 52 is formed on the upper surface 41a of the Cu electrode layer 41 so as to coat substantially the whole area of the upper surface 41a of the Cu electrode layer 41.

The pad electrode layer 52 includes a first part 53 mechanically and electrically connected to the upper surface 41a of the Cu electrode layer 41 and a second part 54 that protrudes from the first part 53 toward a lateral part of the Cu electrode layer 41. The pad electrode layer 52 is in contact with the outer-surface insulating film 50, i.e., more specifically, the second part 54 of the pad electrode layer 52 is in contact with the outer-surface insulating film 50.

The pad electrode layer 52 has a laminated structure including a nickel layer 55 formed on the upper surface 41a of the Cu electrode layer 41 and a palladium layer 56 formed on the nickel layer 55 in the present preferred embodiment. The palladium layer 56 is formed so as to have a thickness smaller than that of the nickel layer 55.

The thickness of the nickel layer 55 may be equal to or larger than 0.5 μm and equal to or smaller than 5 μm. The thickness of the palladium layer 56 may be equal to or larger than 0.05 μm and equal to or smaller than 2 μm. The bonding wire 5 is connected to the pad electrode layer 52 of the wiring layer 13.

FIG. 17A to FIG. 17H are views to describe a process for manufacturing the wiring layer 13 of FIG. 15. A case in which the Cu electrode layer 41 is made of high-purity copper will be hereinafter described as an example.

Figure 17A:
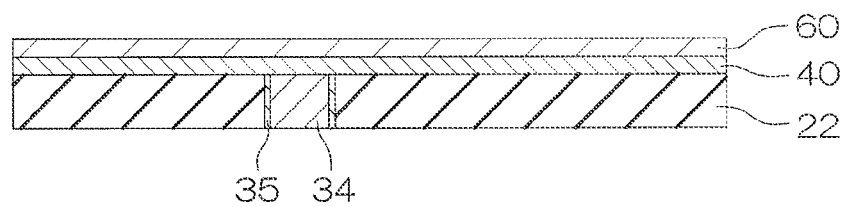

First, referring to FIG. 17A, the semiconductor substrate 20 (see FIG. 15 also) in which the passivation film 22 is formed on the multilayer wiring structure 21 is prepared. The second via electrode 34 that passes through the passivation film 22 and through the third interlayer insulating film 25 is formed in these films.

Thereafter, the barrier electrode layer 40 and the copper seed layer 60 are formed on the surface of the passivation film 22 in this order. The barrier electrode layer 40 and the copper seed layer 60 may be each formed according to a sputtering method. The barrier electrode layer 40 is formed with such a thickness (e.g. a thickness of equal to or larger than 100 nm and equal to or smaller than 500 nm) that the outer-surface insulating film 50 does not come into contact with the passivation film 22.

Figure 17B:
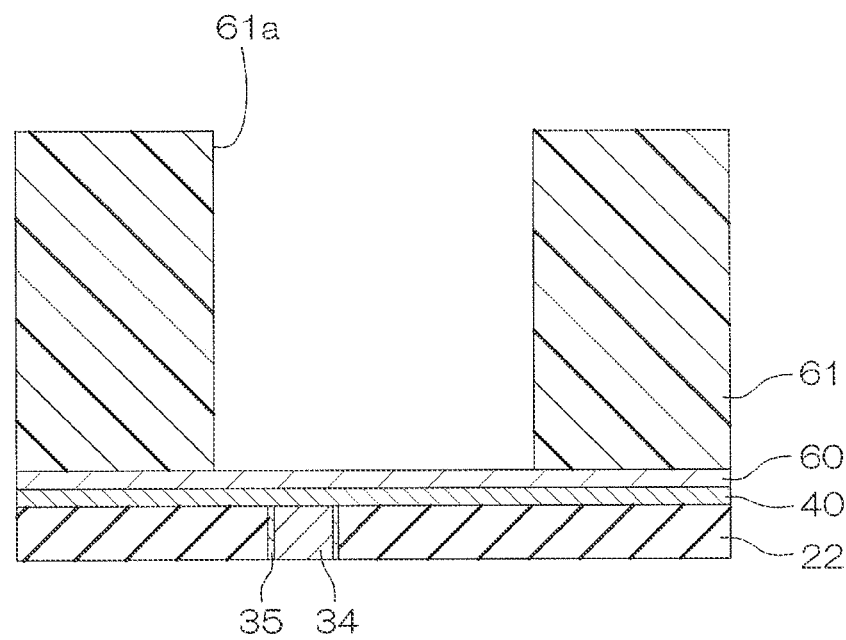

Thereafter, referring to FIG. 17B, a mask 61 having a predetermined pattern is formed on a copper seed layer 60. The mask 61 selectively has an opening 61a that exposes a region in which the Cu electrode layer 41 is to be formed in the copper seed layer 60.

Thereafter, referring to FIG. 17C, the Cu electrode layer 41 is formed. The Cu electrode layer 41 is formed on a surface of the copper seed layer 60 exposed from the opening 61a of the mask 61. The Cu electrode layer 41 may be formed according to an electrolytic copper plating method. The Cu electrode layer 41 is formed so as to extend to a halfway part in a depth direction of the opening 61a of the mask 61. The Cu electrode layer 41 is formed integrally with the copper seed layer 60.

Thereafter, referring to FIG. 17D, the nickel layer 55 and the palladium layer 56 are formed on the upper surface 41a of the Cu electrode layer 41 in this order. The nickel layer 55 and the palladium layer 56 are each formed on the upper surface 41a of the Cu electrode layer 41 exposed from the opening 61a of the mask 61. The nickel layer 55 and the palladium layer 56 may be each formed according to an electroless plating method.

Figure 17E:
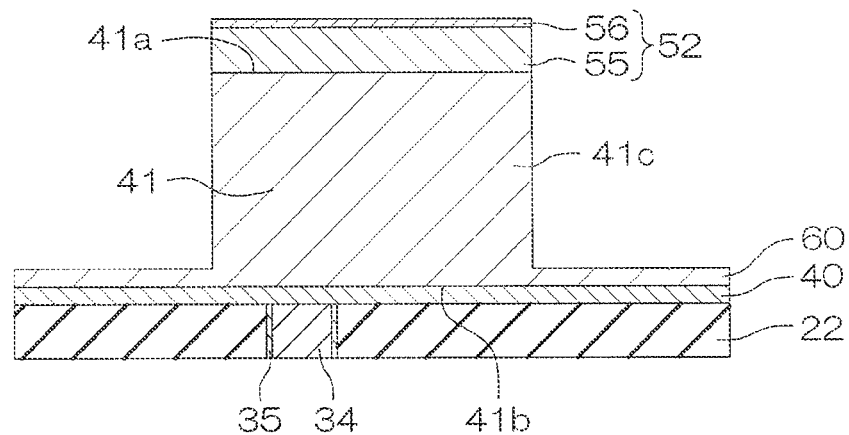

Thereafter, referring to FIG. 17E, the mask 61 is removed.

Figure 17F:
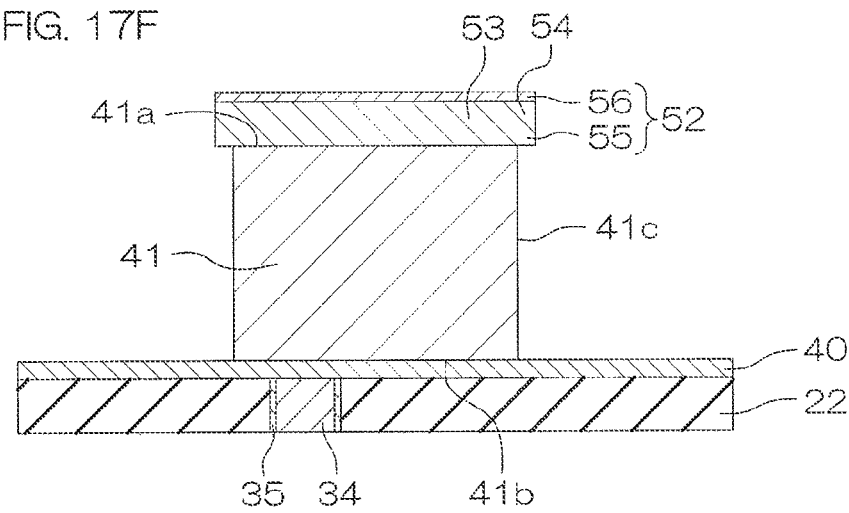

Thereafter, referring to FIG. 17F, needless parts of the copper seed layer 60 are removed. The copper seed layer 60 may be removed by wet etching. In this step, the side surface 41c of the Cu electrode layer 41 is also partly removed in proportion to the thickness of the copper seed layer 60. Therefore, the side surface 41c of the Cu electrode layer 41 is formed so as to be placed at a more inward position than the side surface of the pad electrode layer 52.

As a result, the pad electrode layer 52 is formed. The pad electrode layer 52 includes a first part 53 mechanically and electrically connected to the upper surface 41a of the Cu electrode layer 41 and a second part 54 that protrudes from the first part 53 toward the lateral side of the barrier electrode layer 40.

Figure 17G:
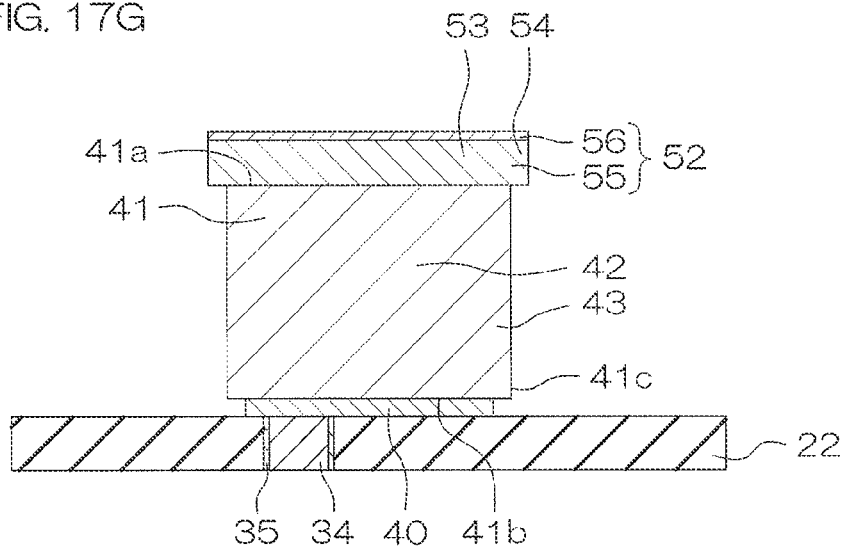

Thereafter, referring to FIG. 17G, needless parts of the barrier electrode layer 40 are removed. The barrier electrode layer 40 may be removed by wet etching. In this step, the barrier electrode layer 40 positioned directly under the Cu electrode layer 41 is partly removed in proportion to the thickness of the barrier electrode layer 40.

Therefore, the side surface of the barrier electrode layer 40 is formed so as to be placed at a more inward position than the side surface 41c of the Cu electrode layer 41. Accordingly, the Cu electrode layer 41 including the first part 42 positioned on the barrier electrode layer 40 and the second part 43 protruding from the first part 42 toward the lateral side of the barrier electrode layer 40 is formed. As a result, the semiconductor chip 4 is formed.

Figure 17H:
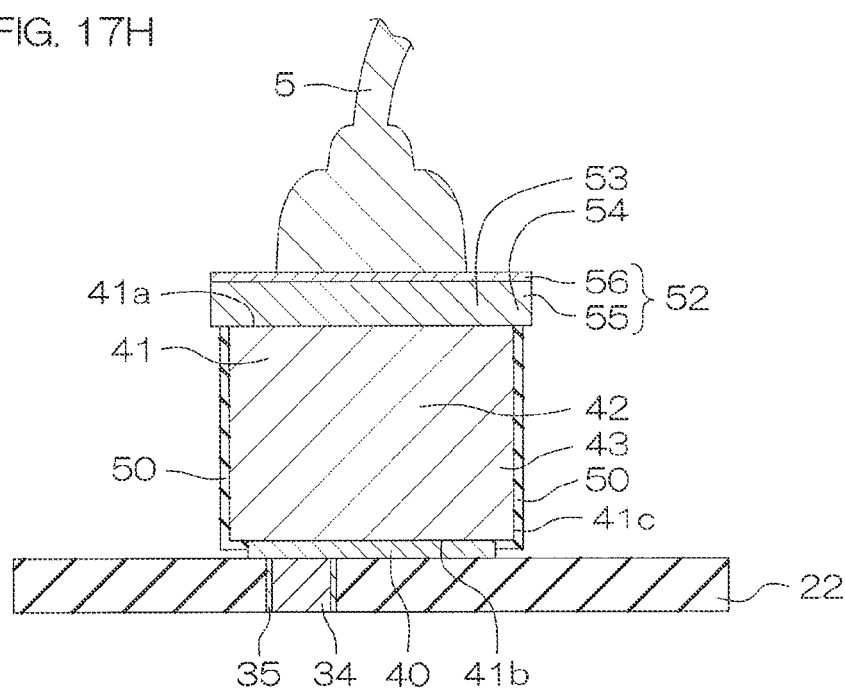

Thereafter, referring to FIG. 17H, the semiconductor substrate 20 is heated, and the bonding wire 5 is joined to the pad electrode layer 52. More specifically, the joining step of the bonding wire 5 is performed after a lead frame (not shown) including the die pad 2 and the lead terminal 3 is prepared and after the semiconductor chip 4 is joined to the die pad 2 of the lead frame.

The semiconductor substrate 20 is heated to, for example, about 200° C. In this step, the Cu electrode layer 41 is also heated in addition to the semiconductor substrate 20, and therefore a natural oxide film that includes copper oxide is formed on the outer surface of the Cu electrode layer 41.

The outer-surface insulating film 50 is formed by this natural oxide film. The barrier electrode layer 40 is formed with such a thickness that the outer-surface insulating film 50 does not come into contact with the passivation film 22. Therefore, the outer-surface insulating film 50 is formed with an interval from the passivation film 22.

Thereafter, the semiconductor chip 4, along with the lead frame, is sealed by the sealing resin 6. Thereafter, the dicing step of the sealing resin 6 is performed, and the semiconductor device 91 is cut out. Through the process including these steps, the semiconductor device 91 is manufactured.

As described above, in the semiconductor device 91, the outer-surface insulating film 50 with which the outer surface of the Cu electrode layer 41 is coated is formed with an interval from the passivation film 22. This makes it possible to restrain a load caused by the thermal expansion of the outer-surface insulating film 50 from being applied onto the passivation film 22 even if the thermal expansion of the outer-surface insulating film 50 occurs during the heating step (see FIG. 17H) of the semiconductor substrate 20.

Additionally, it is possible to restrain a load caused by the thermal expansion of the Cu electrode layer 41 from being applied onto the passivation film 22 through the outer-surface insulating film 50 even if the thermal expansion of the Cu electrode layer 41 occurs. Therefore, it is possible to provide the semiconductor device 91 having a structure capable of restraining a crack from occurring in the passivation film 22 placed below the Cu electrode layer 41.

Additionally, in the semiconductor device 91, the barrier electrode layer 40 has a coefficient of thermal expansion lower than that of the Cu electrode layer 41. Therefore, it is possible to make the amount of deformation caused by the thermal expansion of the barrier electrode layer 40 smaller than that of the Cu electrode layer 41.

As a result, it is possible to restrain a load from being transmitted from the barrier electrode layer 40 to the passivation film 22, and it is possible to restrain a load from being transmitted from the Cu electrode layer 41 to the passivation film 22 through the barrier electrode layer 40. Therefore, it is possible to restrain a crack from occurring in the passivation film 22.

Particularly when the barrier electrode layer 40 has a modulus of rigidity higher than that of the Cu electrode layer 41, it is possible to restrain the deformation of the barrier electrode layer 40 from being caused by a load from the Cu electrode layer 41. As a result, it is possible to effectively restrain the load from the Cu electrode layer 41 from being transmitted to the passivation film 22 through the barrier electrode layer 40.

FIG. 18 is an enlarged view of a part corresponding to FIG. 15, showing the wiring layer 13 of a semiconductor device 101 and a structure therearound according to a fifth preferred embodiment of the present invention. Hereinafter, the same reference sign is given to a structure corresponding to each structure described with respect to the semiconductor devices 1, 71, 81, and 91. Additionally, hereinafter, a description of a structure corresponding to the structure described with respect to the semiconductor device 91 is omitted.

Referring to FIG. 18, the semiconductor device 101 includes the passivation film 22. The barrier electrode layer 40 is formed on the passivation film 22. The Cu electrode layer 41 is formed on the barrier electrode layer 40. The outer-surface insulating film 50 is formed on the outer surface of the Cu electrode layer 41. The pad electrode layer 52 is formed on the upper surface 41a of the Cu electrode layer 41.

The semiconductor device 101 additionally includes the resin film 72 with which the outer surface of the Cu electrode layer 41 is coated through the outer-surface insulating film 50.

The resin film 72 includes a resin material different from the resin material of the sealing resin 6. The resin film 72 may include at least one kind of phenol resin, polyimide resin, or polyamide resin.

The resin film 72 coats the outer surface of the pad electrode layer 52 in addition to the outer surface of the Cu electrode layer 41. The resin film 72 includes the pad opening 73 that exposes the upper surface of the pad electrode layer 52 to which the bonding wire 5 is connected. The resin film 72 fills the space between the passivation film 22 and the facing portion 45 of the Cu electrode layer 41.

In the present preferred embodiment, the bonding wire 5 is joined to the pad electrode layer 52 after the resin film 72 is formed. Therefore, a part of the outer surface of the Cu electrode layer 41 that is not coated with the resin film 72 does not come into contact with open air, and therefore the outer-surface insulating film 50 including a natural oxide film is restrained from being formed on the outer surface of the Cu electrode layer 41.

The sealing resin 6 fills the pad opening 73 formed in the resin film 72, and coats the resin film 72.

The coating portion 51 of the outer-surface insulating film 50 is not necessarily formed at the facing portion 45 of the Cu electrode layer 41 although a form in which the coating portion 51 of the outer-surface insulating film 50 is formed at the facing portion 45 of the Cu electrode layer 41 is shown in FIG. 18.

The outer-surface insulating film 50 may include the coating portion 51 with which the facing portion 45 of the Cu electrode layer 41 is coated and a part by which the facing portion 45 of the Cu electrode layer 41 is exposed. The thickness T3 of the outer-surface insulating film 50 interposed between the Cu electrode layer 41 and the resin film 72 may be equal to or larger than 0 nm and equal to or smaller than 400 nm. Preferably, the thickness T3 of the outer-surface insulating film 50 is equal to or larger than 0 nm and equal to or smaller than 200 nm.

In a case in which the coating portion 51 of the outer-surface insulating film 50 is formed at the facing portion 45 of the Cu electrode layer 41, the resin film 72 is in contact with the coating portion 51 of the outer-surface insulating film 50 in a region between the passivation film 22 and the facing portion 45 of the Cu electrode layer 41. The coating portion 51 of the outer-surface insulating film 50 faces the passivation film 22 through the resin film 72.

On the other hand, In a case in which the coating portion 51 of the outer-surface insulating film 50 is not formed at the facing portion 45 of the Cu electrode layer 41, the resin film 72 is in contact with both the passivation film 22 and the Cu electrode layer 41 in the region between the passivation film 22 and the facing portion 45 of the Cu electrode layer 41.

FIG. 19A to FIG. 19D are views to describe a process for manufacturing the wiring layer 13 of FIG. 18. A case in which the Cu electrode layer 41 is made of high-purity copper will be hereinafter described as an example.

Figure 19A:
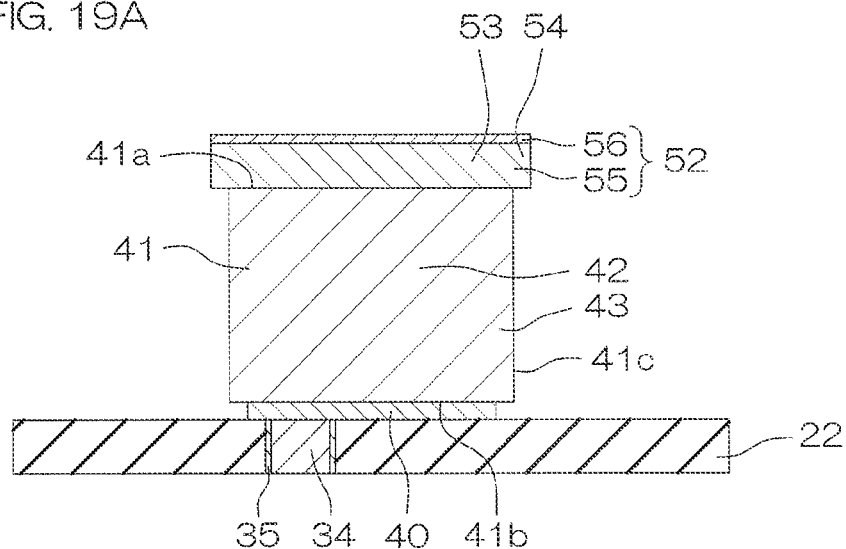
FIG. 19A to FIG. 19D are views to describe a process for manufacturing the wiring layer of FIG. 18.

First, referring to FIG. 19A, a semi-finished product having a structure in which the wiring layer 13 is formed on the passivation film 22 is prepared through the steps of FIG. 17A to FIG. 17G.

Figure 19B:
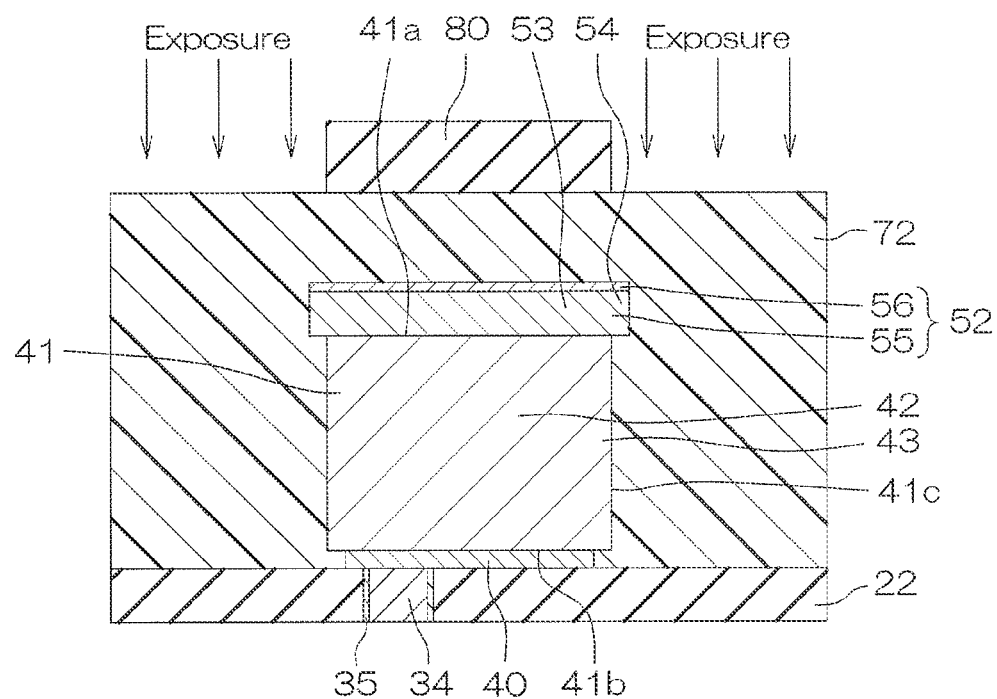

Thereafter, referring to FIG. 19B, the resin film 72 is formed on the passivation film 22 so as to coat the wiring layer 13. The resin film 72 is formed by applying, for example, a photosensitive resin (phenol resin in the present preferred embodiment). Thereafter, the resin film 72 is exposed through a photomask 80 with which a region in which the pad opening 73 is to be formed is coated.

Figure 19C:
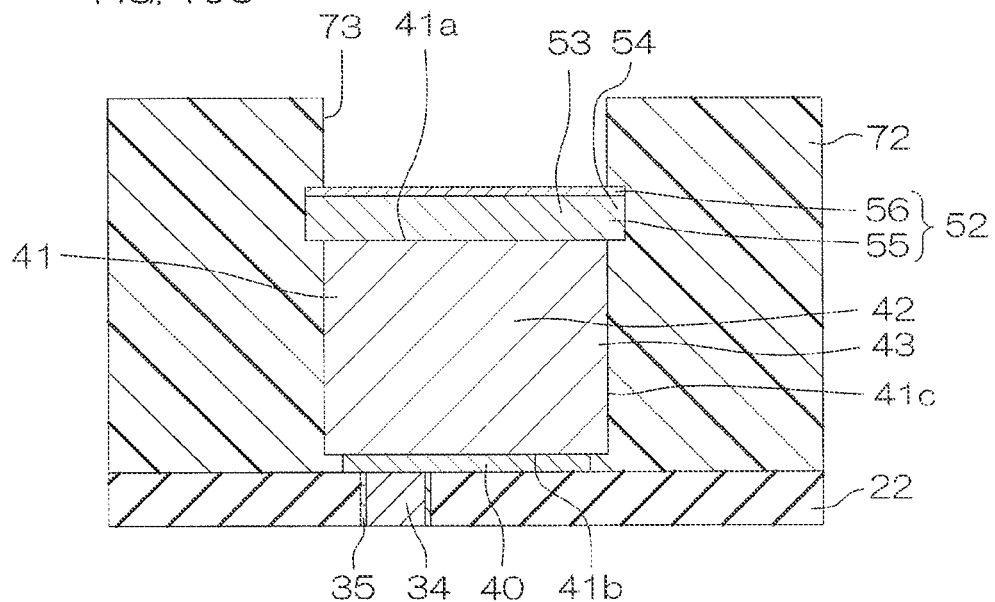

Thereafter, referring to FIG. 19C, the resin film 72 is developed, and the pad opening 73 is formed.

Figure 19D:
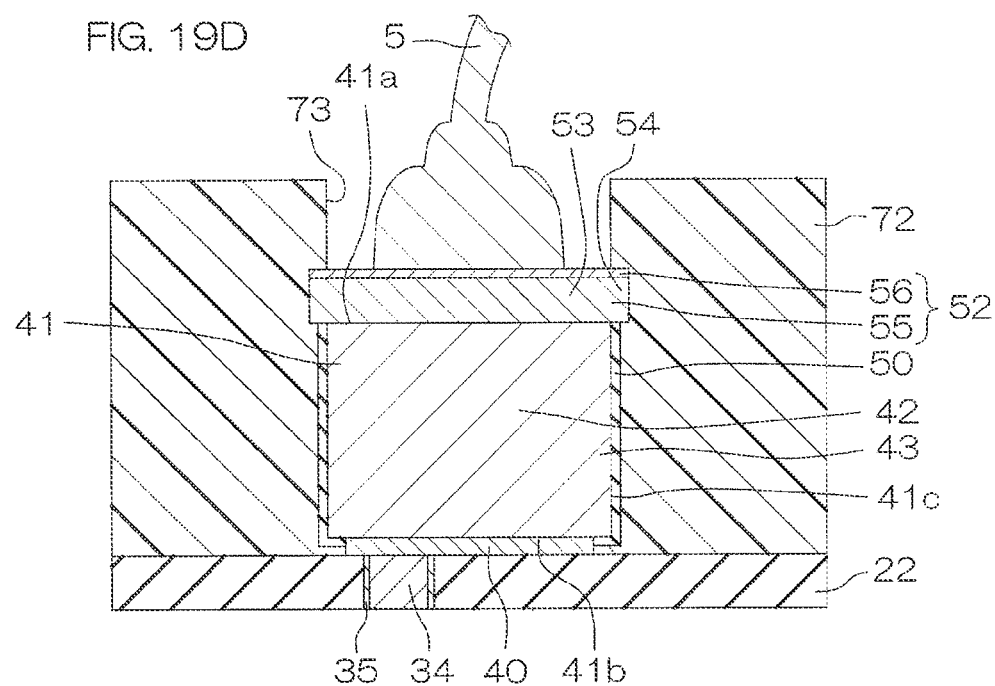

Thereafter, referring to FIG. 19D, the semiconductor substrate 20 is heated, and the bonding wire 5 is joined to the pad electrode layer 52. The joining step of the bonding wire 5 is performed after a lead frame (not shown) including the die pad 2 and the lead terminal 3 is prepared and after the semiconductor chip 4 is joined to the die pad 2 of the lead frame.

The semiconductor substrate 20 is heated to, for example, about 200° C. In this step, the Cu electrode layer 41 is also heated in addition to the semiconductor substrate 20, and therefore a natural oxide film that includes copper oxide is formed on the outer surface of the Cu electrode layer 41.

The outer-surface insulating film 50 is formed by this natural oxide film. Thereafter, the semiconductor chip 4, along with the lead frame, is sealed by the sealing resin 6. Thereafter, the dicing step of the sealing resin 6 is performed, and the semiconductor device 101 is cut out. Through the process including these steps, the semiconductor device 101 is manufactured.

Figure 20:
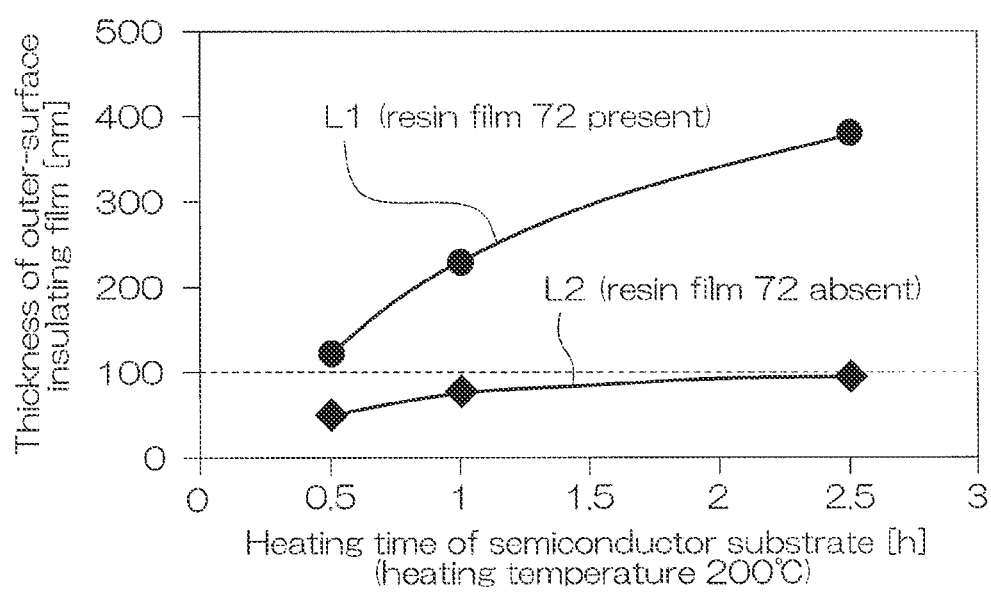
FIG. 20 is a graph showing a result obtained by a simulation concerning a relationship between the thickness of an outer-surface insulating film and a heating time.

FIG. 20 is a graph showing a result obtained by a simulation concerning a relationship between the thickness T3 of the outer-surface insulating film 50 and a heating time. In FIG. 20, the ordinate axis represents the thickness T3 of the outer-surface insulating film 50, and the abscissa axis represents the heating time of the semiconductor substrate 20. The heating temperature of the semiconductor substrate 20 is about 200° C.

A curve L1 and a curve L2 are shown in FIG. 20. The curve L1 shows a relationship when the resin film 72 is not formed. The curve L2 shows a relationship when the resin film 72 is formed.

Referring to the curve L1 and the curve L2, it was understood that the thickness T3 of the outer-surface insulating film 50 becomes smaller in proportion to the shortening of the heating time of the semiconductor substrate 20 whereas the thickness T3 of the outer-surface insulating film 50 becomes larger in proportion to the lengthening of the heating time of the semiconductor substrate 20.

Referring to the curve L1, when the resin film 72 was not formed, the thickness T3 of the outer-surface insulating film 50 exceeded 100 nm in a heating time of 0.5 hours, and exceeded 350 nm in a heating time of 2.5 hours.

On the other hand, referring to the curve L2, when the resin film 72 was formed, the thickness T3 of the outer-surface insulating film 50 was equal to or smaller than 100 nm even in a heating time of 2.5 hours. Therefore, it was understood that the formation of the resin film 72 that coats the outer surface of the Cu electrode layer 41 makes it possible to restrain the outer-surface insulating film 50 (natural oxide film) that is formed on the outer surface of the Cu electrode layer 41 from being thickened.

As described above, in the semiconductor device 101, the resin film 72 that coats the outer surface of the Cu electrode layer 41 through the outer-surface insulating film 50 is formed. This resin film 72 makes it possible to restrain the outer surface of the Cu electrode layer 41 from coming into contact with open air.

Accordingly, it is possible to restrain the outer-surface insulating film 50 (natural oxide film) from being formed on the outer surface of the Cu electrode layer 41, and simultaneously to restrain the outer-surface insulating film 50 (natural oxide film) from growing in the outer surface of the Cu electrode layer 41. As a result, it is possible to restrain the outer-surface insulating film 50 from being thickened, and therefore it is possible to restrain a load from resulting from the thermal expansion of the outer-surface insulating film 50.

Therefore, it is possible to restrain a load from being applied onto the passivation film 22 from the outer-surface insulating film 50, and simultaneously to restrain a load from being applied onto the passivation film 22 from the Cu electrode layer 41 through the outer-surface insulating film 50.

Therefore, it is possible to restrain stress from being applied onto the passivation film 22 placed below the Cu electrode layer 41, and therefore it is possible to restrain a crack from occurring in the passivation film 22 placed below the Cu electrode layer 41.

Particularly in the semiconductor device 101, the resin film 72 fills a space between the passivation film 22 and the facing portion 45 of the Cu electrode layer 41. Accordingly, it is possible to restrain the outer-surface insulating film 50 (natural oxide film) from being formed at the facing portion 45 of the Cu electrode layer 41, and simultaneously to restrain the outer-surface insulating film 50 from coming into contact with the passivation film 22. Therefore, it is possible to effectively restrain a crack from occurring in the passivation film 22 placed below the Cu electrode layer 41.

The present invention can be embodied in other modes although the preferred embodiments of the present invention have been described as above.

The pad electrode layer 52 is formed on the upper surface 41a of the Cu electrode layer 41 as described in the first to fifth preferred embodiments as an example. However, a structure in which the pad electrode layer 52 is not formed on the upper surface 41a of the Cu electrode layer 41 may be employed. In this case, the bonding wire 5 may be joined directly to the upper surface 41a of the Cu electrode layer 41.

In this case, in the second and fifth preferred embodiments, the pad opening 73 of the resin film 72 is formed so as to expose the part to which the bonding wire 5 is connected and so as to coat the outer surface of the Cu electrode layer 41 in the upper surface 41a of the Cu electrode layer 41.

QFN (Quad Flat Non-leaded Package) is applied as a form of the semiconductor package as described in the first to fifth preferred embodiments as an example.

However, other semiconductor packages, such as SOP (Small Outline Package), DFP (Dual Flat Package), DIP (Dual Inline Package), QFP (Quad Flat Package), SIP (Single Inline Package), SOJ (Small Outline J-leaded Package), and TO (Transistor Outline), may be applied, or various semiconductor packages similar to the aforementioned semiconductor packages may be applied without being limited to QFN.

Besides, various design changes can be made within the scope of the subject matter mentioned in the claims. Feature examples extracted from the present description and from the drawings are as follows.

[Clause 1] A semiconductor device including an insulating layer, a barrier electrode layer formed on the insulating layer, a Cu electrode layer that includes a metal composed mainly of copper and that is formed on the barrier electrode layer, and an outer-surface insulating film that includes copper oxide and with which an outer surface of the Cu electrode layer is coated with an interval from the insulating layer.

In this semiconductor device, the outer-surface insulating film with which the outer surface of the Cu electrode layer is coated is formed with an interval from the insulating layer. This makes it possible to restrain a load caused by the thermal expansion of the outer-surface insulating film from being applied onto the insulating layer that is in contact with the outer-surface insulating film, and makes it possible to restrain a load caused by the thermal expansion of the Cu electrode layer from being applied onto the insulating layer through the outer-surface insulating film. Therefore, it is possible to provide a semiconductor device capable of restraining a crack from occurring in the insulating layer placed below the Cu electrode layer.

[Clause 2] The semiconductor device according to Clause 1, wherein the Cu electrode layer includes a first part positioned on the barrier electrode layer and a second part that protrudes from the first part toward a lateral side of the barrier electrode layer and that has a facing portion facing the insulating layer with an interval from the insulating layer, and wherein a coating portion with which the facing portion of the second part is coated in the outer-surface insulating film is formed with an interval from the insulating layer.

[Clause 3] The semiconductor device according to Clause 2, wherein the first part of the Cu electrode layer has a connection portion connected to the barrier electrode layer, and the facing portion is formed so as to be flush with the connection portion of the first part in the second part of the Cu electrode layer.

[Clause 4] The semiconductor device according to any one of Clauses 1 to 3, wherein the outer-surface insulating film includes a natural oxide film formed on the outer surface of the Cu electrode layer.

[Clause 5] The semiconductor device according to any one of Clauses 1 to 4, wherein the outer-surface insulating film has a thickness smaller than a thickness of the barrier electrode layer.

[Clause 6] The semiconductor device according to any one of Clauses 1 to 5, wherein the barrier electrode layer includes a metallic material that has a coefficient of thermal expansion lower than a coefficient of thermal expansion of the Cu electrode layer.

[Clause 7] The semiconductor device according to any one of Clauses 1 to 6, wherein the barrier electrode layer includes at least one kind of titanium, titanium nitride, tantalum, tungsten, molybdenum, chrome, or ruthenium.

[Clause 8] The semiconductor device according to any one of Clauses 1 to 7, wherein the insulating layer includes an oxide film or a nitride film.

[Clause 9] The semiconductor device according to any one of Clauses 1 to 8, further including a wire electrically connected to the Cu electrode layer.

[Clause 10] The semiconductor device according to any one of Clauses 1 to 8, further including a pad electrode layer formed on the Cu electrode layer and a wire electrically connected to the pad electrode layer.

[Clause 11] The semiconductor device according to Clause 10, wherein the pad electrode layer includes a nickel layer and a palladium layer formed on the nickel layer.

[Clause 12] The semiconductor device according to any one of Clauses 9 to 11, wherein the wire includes a bonding wire.

[Clause 13] A semiconductor device including an insulating layer, a barrier electrode layer formed on the insulating layer, a Cu electrode layer that includes a metal composed mainly of copper and that is formed on the barrier electrode layer, an outer-surface insulating film that includes copper oxide and with which an outer surface of the Cu electrode layer is coated, and a resin film with which the outer surface of the Cu electrode layer is coated through the outer-surface insulating film.

In this semiconductor device, a resin film with which the outer surface of the Cu electrode layer is coated through the outer-surface insulating film is formed. With this resin film, it is possible to restrain the outer surface of the Cu electrode layer from coming into contact with open air, and therefore it is possible to restrain copper oxide from being formed on the outer surface of the Cu electrode layer.

This makes it possible to restrain the outer-surface insulating film from being thickened, and hence makes it possible to restrain a load from being caused by the thermal expansion of the outer-surface insulating film. Therefore, it is possible to restrain a load from being applied from the outer-surface insulating film to the insulating layer, and it is possible to restrain a load from being applied from the Cu electrode layer to the insulating layer through the outer-surface insulating film. Therefore, it is possible to restrain stress from being applied onto the insulating layer placed below the Cu electrode layer, and therefore it is possible to provide a semiconductor device capable of restraining a crack from occurring in the insulating layer placed below the Cu electrode layer.

[Clause 14] The semiconductor device according to Clause 13, wherein the Cu electrode layer includes a first part positioned on the barrier electrode layer and a second part that protrudes from the first part toward a lateral side of the barrier electrode layer and that has a facing portion facing the insulating layer with an interval from the insulating layer, and wherein the resin film fills a space between the insulating layer and the facing portion of the Cu electrode layer.

[Clause 15] The semiconductor device according to Clause 14, wherein the outer-surface insulating film includes a coating portion with which the facing portion of the Cu electrode layer is coated and that faces the insulating layer with the resin film between the coating portion and the insulating layer.

[Clause 16] The semiconductor device according to Clause 14 or Clause 15, wherein the first part of the Cu electrode layer has a connection portion connected to the barrier electrode layer, and the facing portion is formed so as to be flush with the connection portion of the first part in the second part of the Cu electrode layer.

[Clause 17] The semiconductor device according to any one of Clauses 13 to 16, wherein the outer-surface insulating film coats the outer surface of the Cu electrode layer with an interval from the insulating layer.

[Clause 18] The semiconductor device according to any one of Clauses 13 to 17, wherein the resin film includes at least one kind of phenol resin, polyimide resin, or polyamide resin.

[Clause 19] The semiconductor device according to any one of Clauses 13 to 18, wherein the outer-surface insulating film has a thickness smaller than a thickness of the barrier electrode layer.

[Clause 20] The semiconductor device according to any one of Clauses 13 to 19, wherein the thickness of the outer-surface insulating film is equal to or smaller than 400 nm.

[Clause 21] The semiconductor device according to any one of Clauses 13 to 20 further including a wire electrically connected to the Cu electrode layer, wherein the resin film coats the outer surface of the Cu electrode layer so as to expose a part to which the wire is connected in the Cu electrode layer.

[Clause 22] The semiconductor device according to any one of Clauses 13 to 20 further including a pad electrode layer formed on the Cu electrode layer and a wire electrically connected to the pad electrode layer, wherein the resin film coats an outer surface of the pad electrode layer so as to expose a part to which the wire is connected in the pad electrode layer.

[Clause 23] The semiconductor device according to Clause 21 or Clause 22, wherein the wire includes a bonding wire.

The present application corresponds to Japanese Patent Application No. 2016-190018 filed in the Japan Patent Office on Sep. 28, 2016, Japanese Patent Application No. 2016-190019 filed in the Japan Patent Office on Sep. 28, 2016, and Japanese Patent Application No. 2017-177980 filed in the Japan Patent Office on Sep. 15, 2017, and the entire disclosures of these applications are incorporated herein by reference.

Although the preferred embodiments of the present invention have been described in detail, these preferred embodiments are merely concrete examples used to clarify the technical contents of the present invention, and the present invention should not be understood by being limited to these concrete examples, and the scope of the present invention is limited solely by the appended claims.

What is claimed is:

1. A semiconductor device comprising:
an insulating layer;
a barrier electrode layer formed over a part of a region of a surface of the insulating layer;
a bonding pad formed on a principal surface of the barrier electrode layer,
wherein the bonding pad has three layers which include a Cu electrode layer that includes a metal composed mainly of copper, a nickel layer, and a surface metal layer, those layers are formed from bottom to top; and
wherein a surface of the surface metal layer is fully exposed from the insulating layer for connecting a bonding wire on the surface, a thickness of the surface metal layer is thinner than a thickness of the nickel layer, and a thickness of the nickel layer is thinner than a thickness of the Cu electrode layer.

2. The semiconductor device according to claim 1, wherein a width of the surface metal layer is wider than a width of the Cu electrode layer in a sectional view.

3. The semiconductor device according to claim 1, wherein a curved portion is formed around a bottom of the Cu electrode layer to make an upper portion of the Cu electrode layer wider.

4. The semiconductor device according to claim 3, wherein an insulating material is intruding to the curved portion so that part of the Cu electrode layer is on the insulating material.

5. The semiconductor device according to claim 1, wherein a thickness of the insulating layer is thicker than a thickness of the barrier electrode layer.

6. The semiconductor device according to claim 1, wherein the Cu electrode layer and the insulating layer are connected by the barrier electrode layer disposed between the Cu electrode layer and the insulating layer.

7. The semiconductor device according to claim 6, wherein a side surface of the Cu electrode layer is positioned inside a peripheral edge of the barrier electrode layer so that the Cu electrode layer is separated from the insulating layer.

8. The semiconductor device according to claim 5, further comprising a sealing resin that seals up the insulating material.

9. The semiconductor device according to claim 8, wherein the sealing resin is contacted with the insulating layer and seals up the insulating layer.

10. The semiconductor device according to claim 9, wherein the barrier electrode layer contacts with the sealing resin and the insulating layer and is positioned between the sealing resin and the insulating layer.

11. The semiconductor device according to claim 1, wherein the barrier electrode layer is narrower than the Cu electrode layer in a plan view.

12. The semiconductor device according to claim 11, wherein the Cu electrode layer is overlapped with a peripheral portion of the barrier electrode layer in the plan view.

13. The semiconductor device according to claim 4, wherein the insulating material is in contact with the principal surface of the barrier electrode layer at a position with an interval from a peripheral edge of the barrier electrode layer toward an inward side of the barrier electrode layer.

14. The semiconductor device according to claim 13, wherein the Cu electrode layer includes:
   a first surface and a second surface that is positioned on a side opposite to the first surface and that is connected to the barrier electrode layer; and
   a peripheral edge of the second surface of the Cu electrode layer is formed at a position with an interval from the peripheral edge of the barrier electrode layer toward the inward side of the barrier electrode layer.

15. The semiconductor device according to claim 1, wherein the Cu electrode layer includes:
   a first surface and a second surface that is positioned on a side opposite to the first surface and that is connected to the barrier electrode layer; and
   the second surface of the Cu electrode layer is formed narrower than the first surface of the Cu electrode layer with respect to a direction along a surface of the insulating layer.

16. The semiconductor device according to claim 4, wherein the insulating material includes a natural oxide formed on an outer surface of the Cu electrode layer.

17. The semiconductor device according to claim 1, wherein the insulating layer includes at least one of an oxide film or a nitride film.

18. The semiconductor device according to claim 1, further comprising a wire electrically connected to the Cu electrode layer.

* * * * *